United States Patent
Liu et al.

(10) Patent No.: US 11,973,067 B2
(45) Date of Patent: Apr. 30, 2024

(54) METHODS FOR MANUFACTURING A DISPLAY DEVICE

(71) Applicant: InnoLux Corporation, Miao-Li County (TW)

(72) Inventors: Tung-Kai Liu, Miao-Li County (TW); Tsau-Hua Hsieh, Miao-Li County (TW); Fang-Ying Lin, Miao-Li County (TW); Kai Cheng, Miao-Li County (TW); Hui-Chieh Wang, Miao-Li County (TW); Shun-Yuan Hu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 437 days.

(21) Appl. No.: 17/410,445

(22) Filed: Aug. 24, 2021

(65) Prior Publication Data
US 2021/0384174 A1    Dec. 9, 2021

Related U.S. Application Data

(62) Division of application No. 16/862,896, filed on Apr. 30, 2020, now Pat. No. 11,133,295, which is a
(Continued)

(30) Foreign Application Priority Data

Mar. 30, 2018 (CN) .......................... 201810292507.7

(51) Int. Cl.
    *H01L 25/075*      (2006.01)
    *H01L 23/00*      (2006.01)
(Continued)

(52) U.S. Cl.
CPC .......... *H01L 25/0753* (2013.01); *H01L 24/00* (2013.01); *H01L 33/0095* (2013.01);
(Continued)

(58) Field of Classification Search
CPC . H01L 25/0753; H01L 24/00; H01L 33/0095; H01L 33/505; H01L 33/62;
(Continued)

(56) References Cited

U.S. PATENT DOCUMENTS

2018/0166429 A1*    6/2018    Chong .................... H01L 27/15

* cited by examiner

*Primary Examiner* — Thanhha S Pham
(74) *Attorney, Agent, or Firm* — McClure, Qualey & Rodack, LLP

(57) ABSTRACT

Methods for manufacturing a display device are provided. The methods include providing a plurality of light-emitting units and a substrate. The methods also include transferring the light-emitting units to a transfer head. The methods further include attaching at least one of the plurality of light-emitting units on the transfer head to the substrate by a bonding process, wherein the transfer head and the substrate satisfy the following equation during the bonding process:

$$0 \leq \left| \int_{T1}^{T2} A(T)dT - \int_{T1}^{T3} E(T)dT \right| < 0.01$$

wherein A(T) is the coefficient of thermal expansion of the transfer head, E(T) is the coefficient of thermal expansion of the substrate, T1 is room temperature, T2 is the temperature of the transfer head, and T3 is the temperature of the substrate.

6 Claims, 34 Drawing Sheets

Related U.S. Application Data division of application No. 16/028,764, filed on Jul. 6, 2018, now abandoned.

(60) Provisional application No. 62/560,694, filed on Sep. 20, 2017, provisional application No. 62/539,579, filed on Aug. 1, 2017.

(51) Int. Cl.
*H01L 33/00* (2010.01)
*H01L 33/50* (2010.01)
*H01L 33/62* (2010.01)

(52) U.S. Cl.
CPC ............ *H01L 33/505* (2013.01); *H01L 33/62* (2013.01); *H01L 2933/0041* (2013.01); *H01L 2933/0066* (2013.01)

(58) Field of Classification Search
CPC ..... H01L 2933/0041; H01L 2933/0066; H01L 21/6835; H01L 24/13; H01L 24/16; H01L 2221/68354; H01L 2221/68363; H01L 2221/68381; H01L 2224/0401; H01L 2224/0603; H01L 2224/29138; H01L 2224/2919; H01L 2224/29191; H01L 2224/32225
See application file for complete search history.

METHODS FOR MANUFACTURING A DISPLAY DEVICE

CROSS REFERENCE TO RELATED APPLICATIONS

This application is a divisional application of U.S. application Ser. No. 16/862,896, filed on Apr. 30, 2020, which is a divisional application of U.S. application Ser. No. 16/028,764, filed on Jul. 6, 2018, which claims priority of China Patent Application No. 201810292507.7 filed on Mar. 30, 2018, and claims priority of a provisional application of U.S. Patent Application No. 62/539,579 filed on Aug. 1, 2017, and also claims priority of a provisional application of U.S. Patent Application No. 62/560,694 filed on Sep. 20, 2017, the entirety of which is incorporated by reference herein.

BACKGROUND OF THE INVENTION

Field of the Invention

The embodiments of the disclosure relate to a method for manufacturing a display device, and in particular to a method for manufacturing a display device that includes a plurality of light-emitting units.

Description of the Related Art

As digital technology develops, display devices have been used more widely in society. For example, the display devices have been applied in modern information and communication devices such as televisions, notebooks, computers, mobile phones and smartphones. In addition, each generation of the display devices has been developed to be thinner, lighter, smaller, and more fashionable than the previous generation. These display devices include light-emitting diode display devices.

Since mass production has recently become a trend in the light-emitting diode display device industry, any increase in the yield of manufacturing light-emitting diode display devices will reduce costs and result in huge economic benefits. However, existing light-emitting diode display devices have not been satisfactory in every respect.

Therefore, a cost-effective light-emitting diode display device with improved display quality is needed.

BRIEF SUMMARY OF THE INVENTION

The embodiments of the present disclosure provide methods for manufacturing a display device. The methods also include transferring the light-emitting units to a transfer head. The methods further include attaching at least one of the plurality of light-emitting units on the transfer head to the substrate by a bonding process, wherein the transfer head and the substrate satisfy the following equation during the bonding process:

$$0 \leq \left| \int_{T1}^{T2} A(T)dT - \int_{T1}^{T3} E(T)dT \right| < 0.01,$$

wherein A(T) is the coefficient of thermal expansion of the transfer head, E(T) is the coefficient of thermal expansion of the substrate, T1 is room temperature, T2 is the temperature of the transfer head, and T3 is the temperature of the substrate.

The embodiments of the present disclosure provide methods for manufacturing a display device. The method includes providing a plurality of light-emitting units. The method includes providing a first substrate. The method further includes forming an adhesive layer on a transfer head. In addition, the method also includes attaching the plurality of light-emitting units to the adhesive layer. The method also includes attaching at least one of the light-emitting units to the first substrate.

The embodiments of the present disclosure provide methods for manufacturing a display device. The method includes providing a plurality of light-emitting units. The method also includes providing a substrate; transferring the plurality of light-emitting units to a transfer head. The method further includes applying a laser-light to at least one of the light-emitting units so that the at least one of the light-emitting units projected by the laser-light on the transfer head is attached to the substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1:
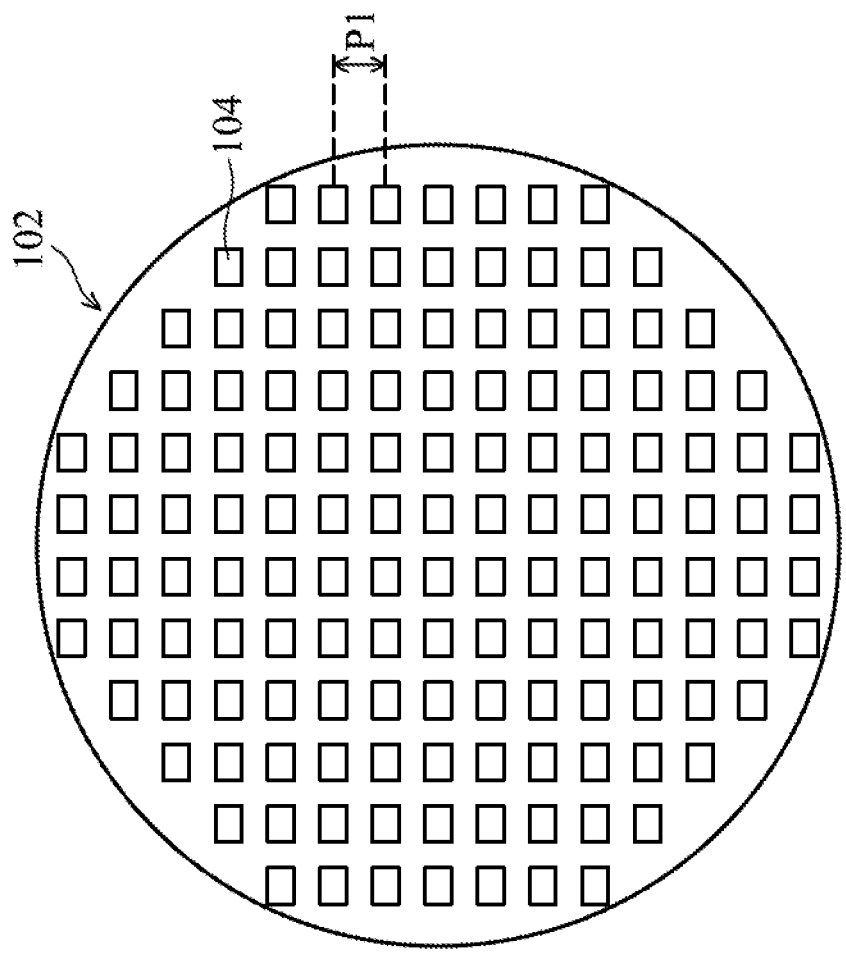
FIG. 1 is a top view of light-emitting units and a semiconductor substrate in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may be already formed over the substrate. However, the substrate is represented with a flat surface in order to simplify the drawing. The term "substrate surface" is meant to include the uppermost exposed layers on a transparent substrate, such as an insulating layer and/or metallurgy lines.

The thickness of a structure described in the embodiments of the disclosure indicates a value for the average thickness of the structure after deleting outliers. The outliers can be the thickness of an edge, an obvious micro-trench, or an obvious micro-raised area. After deleting the outliers, most values of the thickness are within a range of plus or minus three standard deviations.

Referring to FIG. 1, FIG. 1 is a top view of a semiconductor substrate 102 and light-emitting units 104 formed on the semiconductor substrate 102 in accordance with some embodiments of the present disclosure. In some embodiments, as shown in FIG. 1, a plurality of the light-emitting units 104 are formed on the semiconductor substrate 102, and there is a pitch P1 between two adjacent light-emitting units 104. In some examples, the pitch P1 may be defined as a distance between the center points of two adjacent light-emitting units 104. In some embodiments, the pitch P1 is in a range from about 100 μm to about 300 μm. In some embodiments, the semiconductor substrate 102 may be a wafer such as a sapphire substrate which includes alumina oxide and gallium nitride formed thereon.

In some embodiments, the light-emitting unit 104 is a micro light-emitting diode (μLED). The recombination of electron and hole in the micro light-emitting diodes (μLEDs) may produce electromagnetic radiation (such as light) through the current at the p-n junction. The size of the chip of the μLED is in a range from about 1 μm to about 100 μm.

For example, in the forward bias p-n junction formed by direct band gap materials such as GaAs or GaN, the recombination of electron and hole injected into the depletion region results in electromagnetic radiation. The aforementioned electromagnetic radiation may lie in the visible region or the non-visible region. Materials with different band gaps may be used to form micro light-emitting diodes with different colors.

Figure 2:
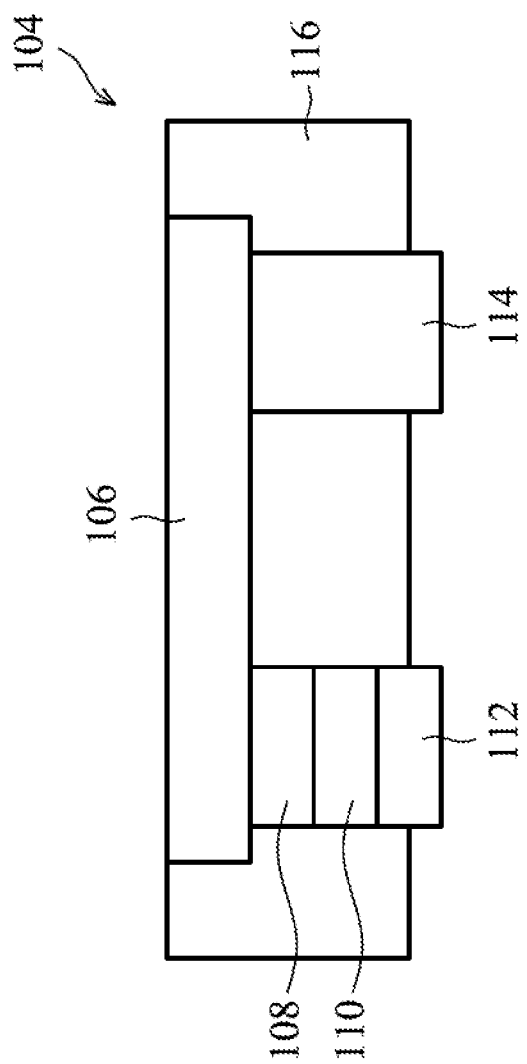
FIG. 2 is a cross-sectional view of a light-emitting unit in accordance with some embodiments of the present disclosure.

Referring to FIG. 2, FIG. 2 is a cross-sectional view of the light-emitting units 104 in accordance with some embodiments of the present disclosure. As shown in FIG. 2, the light-emitting units 104 include a semiconductor layer 106, a light-emitting layer 108, a semiconductor layer 110, a conductive pad 112, a conductive pad 114 and a protective layer 116. The semiconductor layer 106 and the semiconductor layer 110 may respectively connect to the conductive pad 112 and the conductive pad 114. The semiconductor layer 106 and the semiconductor layer 110 may include, but are not limited to, an element semiconductor which may include amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy, GaInAsP alloy, or a combination thereof. The semiconductor layer 106 and the semiconductor layer 110 may also include, but are not limited to, metal oxide such as indium gallium zinc oxide (IGZO), indium zinc oxide (IZO), indium gallium zinc oxide (IGZTO), or organic semiconductor including polycyclic aromatic compound, or a combination thereof.

As shown in FIG. 2, the light-emitting layer 108 is disposed between the semiconductor layer 106 and the semiconductor layer 110. The light-emitting layer 108 may include, but is not limited to, homojunction, heterojunction, single-quantum well (SQW), multiple-quantum well (MQW) or any other applicable structures. In some embodiments, the light-emitting layer 108 includes un-doped n type $In_xGa_{(1-x)}N$. In other embodiments, the light-emitting layer 108 includes other suitable materials such as $Al_xIn_yGa_{(1-x-y)}N$. Moreover, the light-emitting layer 108 may include a multiple-quantum well structure with multiple-quantum layers (such as InGaN) and barrier layers (such as GaN) arranged alternately. Moreover, the light-emitting layer 108 may be formed by metalorganic chemical vapor deposition (MOCVD), molecular beam epitaxy (MBE), hydride vapor phase epitaxy (HVPE), liquid phase epitaxy (LPE) or any other applicable chemical vapor deposition process.

As shown in FIG. 2, the protective layer 116 is disposed on sidewalls of the semiconductor layer 106, the light-emitting layer 108, the semiconductor layer 110, a portion of the conductive pad 112, and a portion of the conductive pad 114. The protective layer 116 is disposed on at least some regions of the light-emitting path. The light-emitting shape may be altered or the light-emitting effectiveness may be improved by the protective layer 116. In some embodiments, the material of the protective layer 116 may be a transparent material or metal.

Figure 3A:
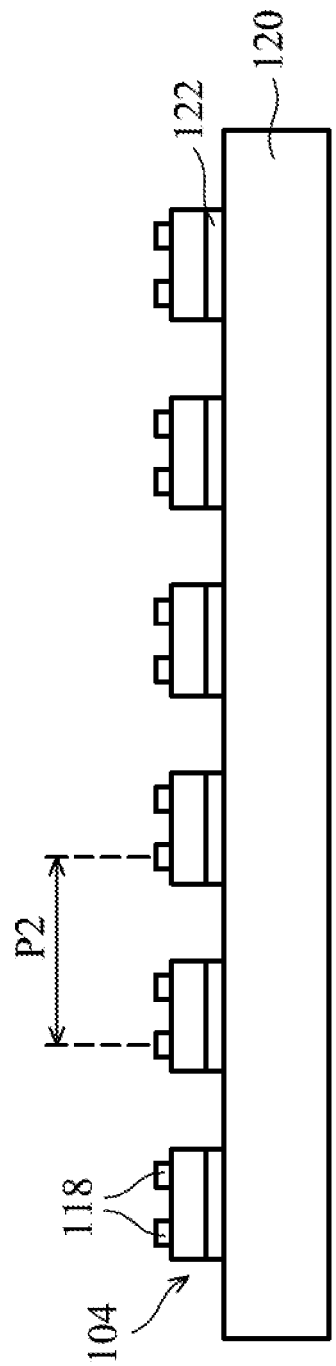
FIGS. 3A-3F are cross-sectional views of various stages of a process for manufacturing a display device in accordance with some embodiments of the present disclosure.

Referring to FIGS. 3A-3F, FIGS. 3A-3F are cross-sectional views of various stages of a process for manufacturing a display device 100A in accordance with some embodiments of the present disclosure. As shown in FIG. 3A, a transfer head 120 is provided. The transfer head 120 may include a transparent substrate, a metal substrate, or a graphite substrate. The transparent substrate may be, for example, a glass substrate, a ceramic substrate, a plastic substrate, a sapphire substrate, or another applicable substrate. In some embodiments, the transfer head 120 may be used as a carrier substrate. In the subsequent processes, the light-emitting units will be disposed on the transfer head 120 temporarily and removed from the transfer head 120.

At first, at least one of the light-emitting units 104 on the semiconductor substrate 102 is transferred to the transfer head 120. In some embodiments, the light-emitting units 104 may be attached to the transfer head 120 through an adhesive layer 122. As shown in FIG. 3A, the adhesive layer 122 is formed on the transfer head 120. The material of the adhesive layer 122 includes, but is not limited to, optical adhesive (OCA), optical clear resin (OCR) or other suitable transparent materials. In some embodiments, the material of the adhesive layer 122 may be formed on the transfer head 120 by an inkjet process, a printing process, or a combination thereof. In some embodiments, the adhesive layer 122 includes an adhesive material including silicon (Si).

As shown in FIG. 3A, bonding pads 118 are formed on a surface of the light-emitting unit 104, and the surface is far from the adhesive layer 122. The bonding pad 118 is configured to electrically connect the light-emitting unit 104 and electronic elements, or connect the light-emitting unit 104 and a substrate having the electronic elements. The material of the bonding pad 118 includes silver (Ag), copper (Cu), aluminum (Al), molybdenum (Mo), tungsten (W), gold (Au), chromium (Cr), nickel (Ni), platinum (Pt), titanium (Ti), the above alloys, the above combination or any other applicable materials. As shown in FIG. 3A, there is a pitch P2 between two adjacent light-emitting units 104 on the transfer head 120. In some embodiments, the pitch P2 may be a distance between the center points of two corresponding bonding pads 118 on two adjacent light-emitting units 104. To be detailed, the pitch P2 may be defined as a distance between the center point of one bonding pad 118 on one light-emitting unit 104 and the center point of one corresponding bonding pad 118 on the adjacent light-emitting unit 104.

Figure 4:
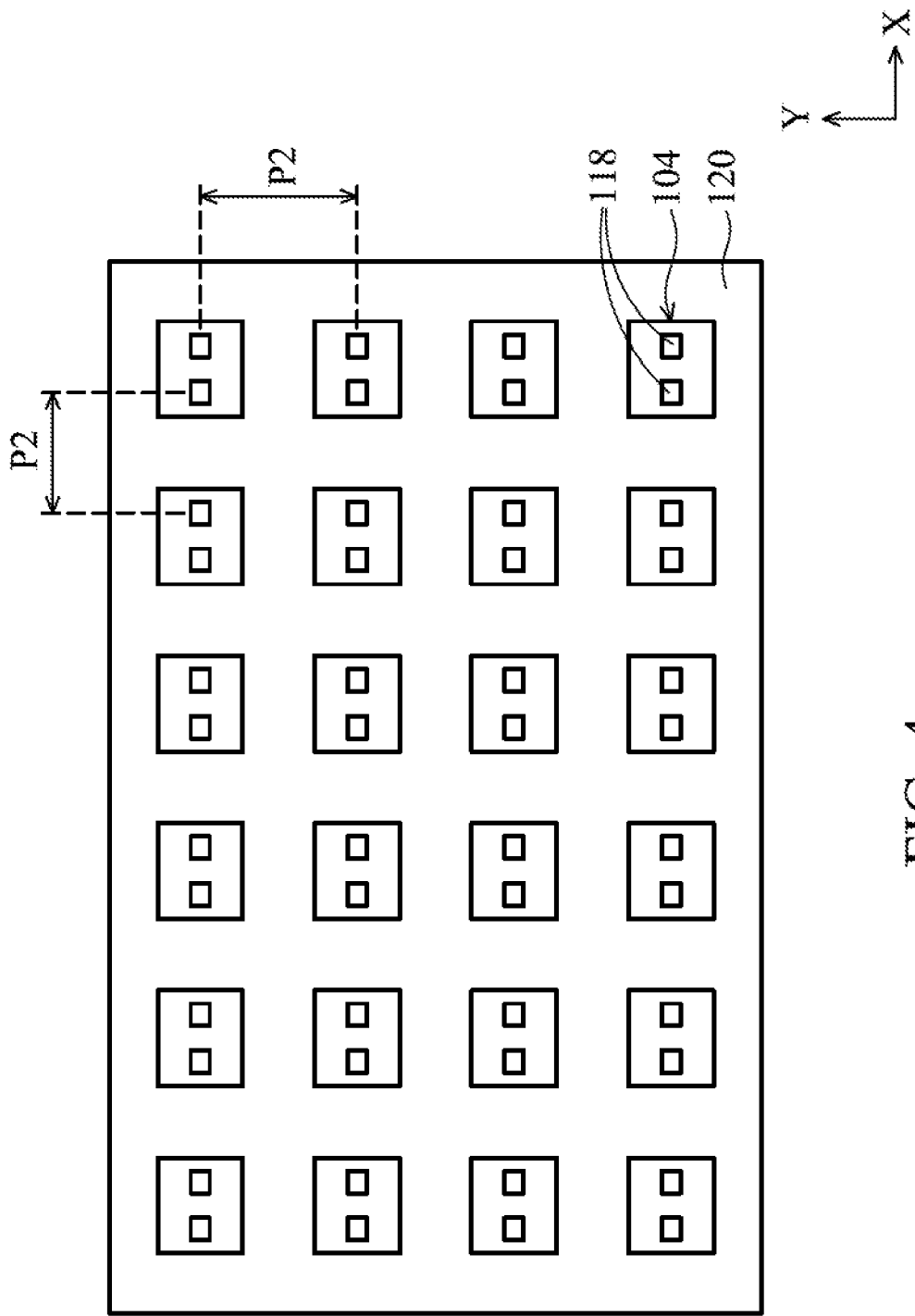
FIG. 4 is a top view of a transfer head and light-emitting units over the transfer head in accordance with some embodiments of the present disclosure.

Referring to FIG. 4, FIG. 4 is a top view of the transfer head 120 and the light-emitting units 104 over the transfer head 120 in accordance with some embodiments of the present disclosure. In some embodiments, as shown in FIG. 4, there is the pitch P2 between two adjacent light-emitting units 104 along a first direction such as X direction. In addition, there is also a pitch P2 between two adjacent light-emitting units 104 along a second direction (such as Y direction) perpendicular to the first direction. Many variations and/or modifications can be made to embodiments of the disclosure. In some embodiments, the pitch between two adjacent light-emitting units 104 along the first direction is different from that between two adjacent light-emitting units 104 along the second direction. In some embodiments, the first direction may be different from the second direction, and the first direction may be not perpendicular to the second direction.

Figure 3B:
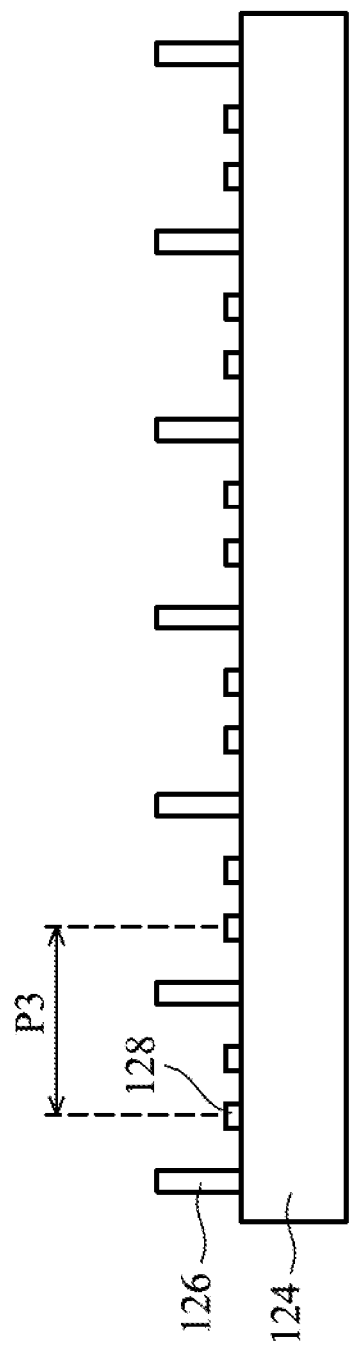

Referring to FIG. 3B, a substrate 124 is provided. The substrate 124 is a backplate of the display device on which the light-emitting units 104 are put. In some embodiments, the substrate 124 may be, for example, a glass substrate, a ceramic substrate, a plastic substrate, a sapphire substrate or another applicable substrate. In some embodiments, the front surface of the substrate 124 is used to dispose the light-emitting units 104. In some embodiments, the semiconductor layer (not shown) is formed on the back surface of the substrate 124. The semiconductor layer may include integrated circuit (IC). The IC may include, but is not limited to, a micro-processor, a memory element and/or other elements. The IC may also include various passive elements, active elements and wires, the passive elements and the active elements may, for example, include thin film resistors, other capacitors (e.g., metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors.

In some embodiments, as shown in FIG. 3B, a spacer layer 126 and bonding pads 128 are formed on the substrate 124. The spacer layer 126 may be used to define the boundary of the pixel of the display device, and the spacer layer 126 has many openings formed therein. The bonding pads 128 are disposed in the openings for attaching to the light-emitting units 104 in the subsequent process.

In some embodiments, the spacer layer 126 includes an insulating material such as photoresist. In some embodiments, a photoresist layer is coated on the substrate 124. Next, the photoresist layer is patterned to form the spacer layer 126 by a lithography process and an etching process. The lithography process includes, but is not limited to, photoresist coating (e.g., spin-on coating), soft baking, mask alignment, exposure, post-exposure baking, developing the photoresist, rinsing and drying (e.g., hard baking). The photolithography process may also be implemented or replaced by another proper method such as maskless photolithography, electron-beam writing or ion-beam writing. The etching process may include, but is not limited to, dry etching, wet etching, and other etching methods. The deposition process includes, but is not limited to, chemical vapor deposition (CVD), sputtering, resistive thermal evaporation, electron beam evaporation, and any other applicable methods. Many variations and/or modifications can be made to embodiments of the disclosure. In some embodiments, the spacer layer 126 is not formed.

The material of the bonding pad 128 may be an alloy with low melting point. In some embodiments, the bonding pad 128 is a eutectic material having a melting point smaller than 300° C. The material of the bonding pad 128 may include, but is not limited to, a tin-indium alloy, a tin-zinc alloy, a tin-silver alloy, a gold-indium alloy, a gold-tin alloy or other suitable materials. In some embodiments, the bonding pad 128 may be a multilayer stack structure, such as a copper/nickel/gold structure or a nickel/platinum/gold structure.

As shown in FIG. 3B, there is a pitch P3 between two corresponding bonding pads 128 separated by the spacer layer 126. In some embodiments, the pitch P3 may be defined as a distance between the center point of one bonding pad 128 and the center point of one corresponding bonding pad 128 separated by the spacer layer 126.

In some embodiments, the pitch P2 may be substantially equivalent to the pitch P3. For example, the pitch P2 may be in a range from 0.9 P3 to 1.1 P3.

Figure 3C:
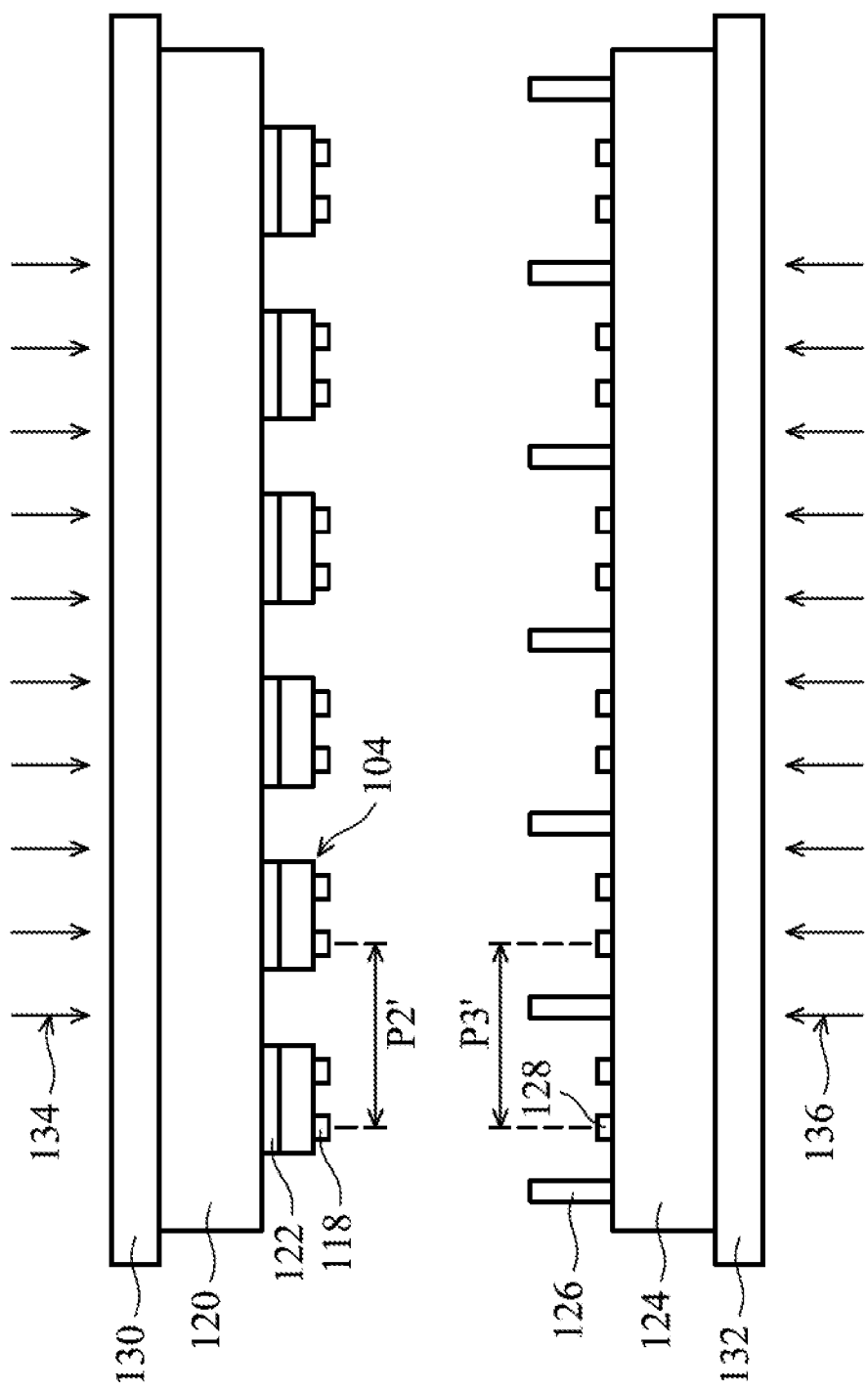

Next, as shown in FIG. 3C, the transfer head 120 is put on a heat plate 130, and a heating process 134 is performed on the heat plate 130 in accordance with some embodiments. During the heating process 134, the temperature of the transfer head 120 is increased from T1 to T2. In some embodiments, T1 is the initial temperature, such as room temperature. T2 is the temperature of the transfer head 120 during the subsequent bonding process. The temperature of the transfer head 120 is T1 before performing the heating process 134, and the distance between the center points of two corresponding bonding pads 118 on two adjacent light-emitting units 104 is the pitch P2. The transfer head 120 is expanded after performing the heating process 134. When the temperature of the transfer head 120 is T2, the pitch P2 increases and becomes a pitch P2'.

In addition, as shown in FIG. 3C, the substrate 124 is put on a heat plate 132, and a heating process 136 is performed on the heat plate 132 in accordance with some embodiments. During performing the heating process 136, the temperature of the substrate 124 is increased from T1 to T3. In some embodiments, T3 is the temperature of the substrate 124 during the subsequent bonding process. The temperature of the substrate 124 is T1 before performing the heating process 136, and the distance between the center points of two corresponding bonding pads 118 separated by the spacer layer 126 is the pitch P3. The substrate 124 is expanded after performing the heating process 134. When the temperature of the substrate 124 is T3, the distance between the center points of two corresponding bonding pads 118 separated by the spacer layer 126 increases and becomes a pitch P3'.

In some embodiments, when the material of the transfer head 120 is different from that of the substrate 124, coefficient of thermal expansion (CTE) of the transfer head 120 is different from CTE of the substrate 124. In some examples, the material of the transfer head means the portion where the light-emitting units contact on. Therefore, T2 of the transfer head 120 and T3 of the substrate 124 are different to allow the pitch P2' to be substantially equivalent to the pitch P3' or allow the difference between the pitch P2' and the pitch P3' to be within the margin. If the temperature of the transfer head 120 is the same as that of the substrate 124, the difference between the pitch P2' and the pitch P3' may be too large so that the bonding pads 118 on the light-emitting units 104 may be not aligned with the bonding pads 128 of the substrate 124.

Figure 3D:
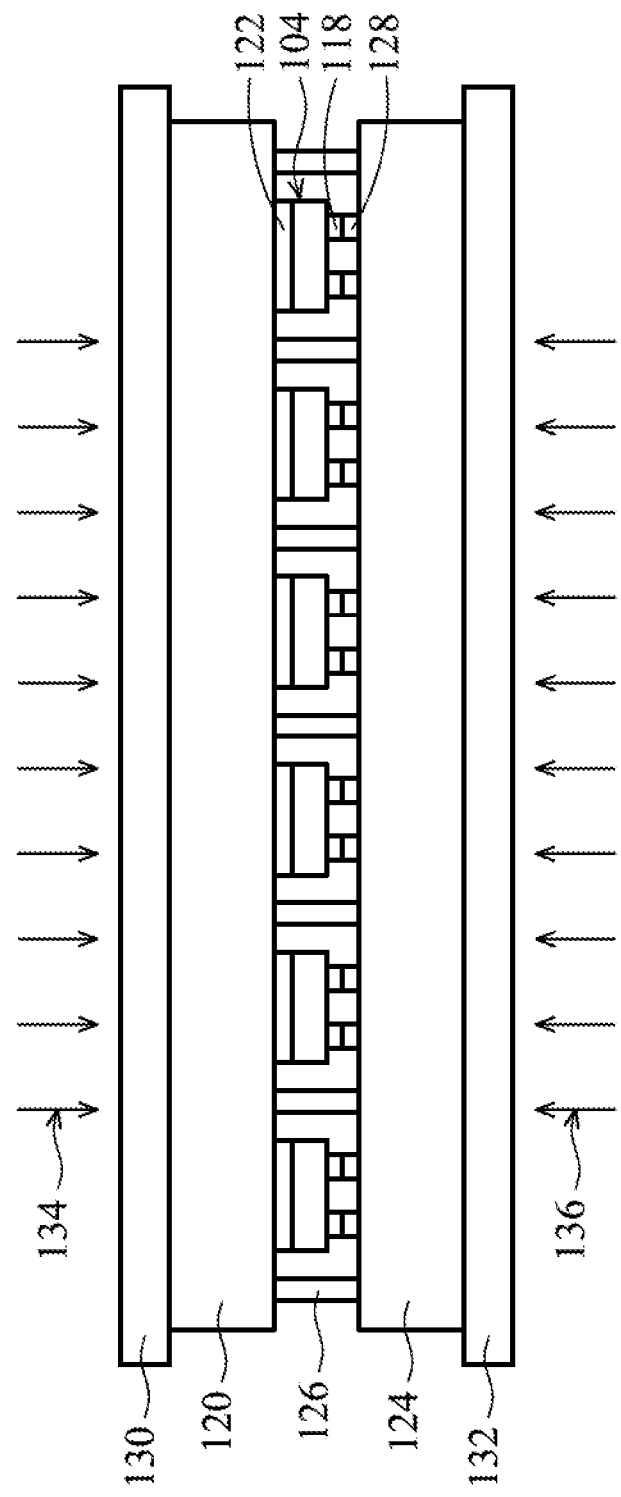

In some embodiments, as shown in FIG. 3D, a bonding process is performed so that the bonding pads 118 on the light-emitting units 104 are aligned with the bonding pads 128 on the substrate 124. In some embodiments, the heating process 134 and the heating process 136 are sustained during the bonding process so that the temperature of the transfer head 120 is maintained at T2 and the temperature of the substrate 124 is maintained at T3. In some embodiments, during the bonding process, to decrease the misalignment between the bonding pads 118 on the light-emitting units 104 and the bonding pads 128 on the substrate 124, the transfer head 120 and the substrate 124 satisfy the following equation (1):

$$0 \leq \left| \int_{T1}^{T2} A(T)dT - \int_{T1}^{T3} E(T)dT \right| < 0.01. \quad \text{equation (1)}$$

The value of equation (1) is an absolute value. A(T) is a function of CTE (SI unit 1/K) of the transfer head 120 against temperature, E(T) is a function of CTE (SI unit 1/K) of the substrate 124 against temperature. In some embodiments, A(T) and E(T) are linear coefficient of thermal expansion.

In some embodiments, during the bonding process, to decrease the misalignment between the bonding pads 118 on the light-emitting units 104 and the bonding pads 128 on the substrate 124, the transfer head 120 and the substrate 124 satisfy the following equation (2):

$$0 \leq \left| \int_{T1}^{T2} A(T)dT - \int_{T1}^{T3} E(T)dT \right| < 0.005. \quad \text{equation (2)}$$

In some embodiments, when T2 and T3 are selected to fit equation (1), the bonding pads 118 on the light-emitting units 104 are aligned with the bonding pads 128 on the substrate 124 even CTE of the transfer head 120 is different from that of the substrate 124.

Figure 3E:
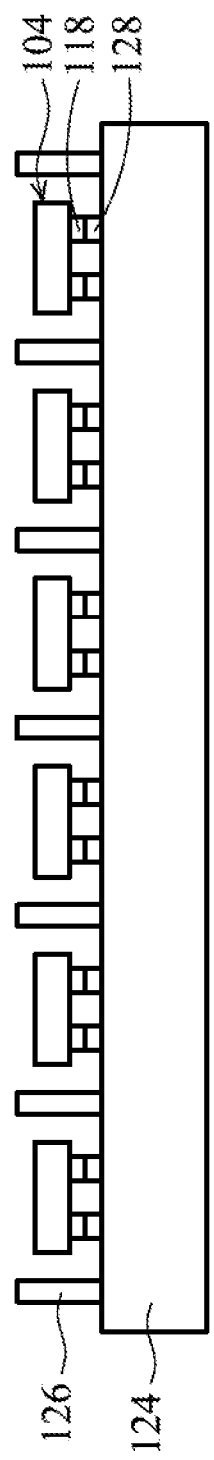

In some embodiments, as shown in FIG. 3E, the light-emitting units 104 are attached to the substrate 124 through the bonding pads 118 and the bonding pads 128. In addition, the transfer head 120, the heat plate 130 and the heat plate 132 are removed after the bonding process. In this embodiment, the material of the transfer head 120 is different from that of the substrate 124. Variations and/or modifications can be made to embodiments of the disclosure. The material of the transfer head 120 is the same as that of the substrate 124. When the material of the transfer head 120 is different from that of the substrate 124, T2 and T3 are selected to decrease the misalignment between the bonding pads 118 on the light-emitting units 104 and the bonding pads 128 on the substrate 124, and thereby the performance of the display device is improved. In some embodiments, the steps shown in FIGS. 3A-3E are repeated so as to attach other light-emitting units 104 on the semiconductor substrate 102 to the substrate 124.

Figure 3F:
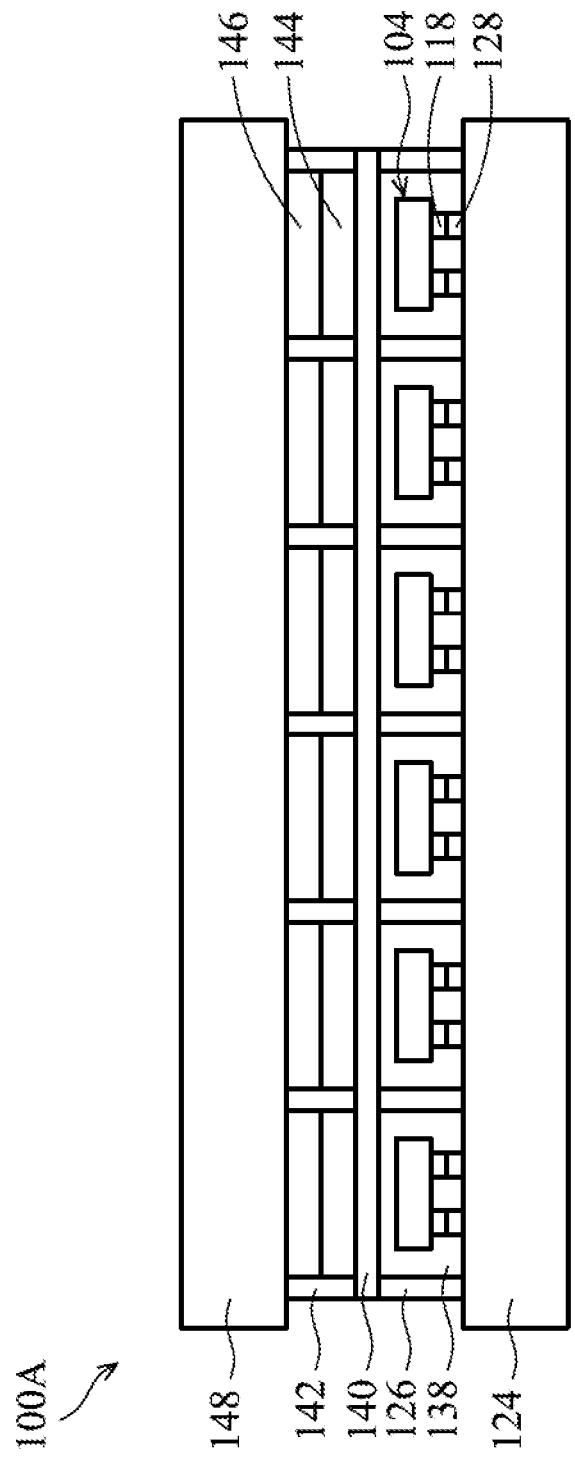

In some embodiments, as shown in FIG. 3F, after the light-emitting units 104 are attached to the substrate 124, a filler 138 is filled into the openings of the spacer layer 126. Moreover, a protective layer 148 having light-shielding layer 142, light filter layers 144 and quantum dot film 146 is attached to the substrate 124 through an adhesive layer 140, and a display device 100A is formed.

In some embodiments, the material of the filler 138 may include, but is not limited to, silicone, epoxy, poly(methyl methacrylate) (PMMA), polycarbonate (PC), and/or other applicable materials. The adhesive layer 140 is used to attach the substrate 124 to the protective layer 148. The material of the adhesive layer 140 may include, but is not limited to, OCA, OCR or other suitable transparent materials.

In some embodiments, the protective layer 148 is an outer surface of the display device 100A and used as a protective layer. The protective layer 148 may, for example, include a glass substrate, a ceramic substrate, a plastic substrate or another applicable substrate. In some embodiments, as shown in FIG. 3F, the top surface of the protective layer 148 may be a planar surface. Variations and/or modifications can be made to embodiments of the disclosure. In some embodiments, the protective layer 148 may not be a planar structure but a bending structure (not shown). For example, the exterior of the protective layer 148 may be seen as a v shape, ω shape, Ω shape, ν shape, σ shape or o shape in a cross-sectional view. There is a highest point in the partial area of the bending structure, such as a ridge point or a top point, and a lowest point in the partial area of the bending structure, such as a saddle point or a concave point.

The light-shielding layer 142 may be aligned to corresponding spacer layers 126 on the substrate 124. The light-shielding layer 142 is used to shield the elements or region which is not used to display colors in the display device 100A. In some embodiment, the light-shielding layer 142 may be a single layer, multiple layers or in a composite way by using photo-curable ink, thermal-curable ink, or another light-shielding material, but it is not limited thereto. The color of the light-shielding layer 142 may be any color, such as white, black, grey, red, green, blue, gold, silver, another suitable color, or a combination thereof, but it is not limited thereto. Moreover, the light-shielding layer 142 may be formed by using a screen printing, an inkjet printing, a transfer printing or other suitable methods.

The light-shielding layer 142 may include multiple light-shielding portions. The quantum dot film 146 is formed between two adjacent light-shielding portions and over the protective layer 148. The material of the quantum dot film 146 may include, but is not limited to, an organic layer blended with quantum dots or an inorganic layer blended with quantum dots. The quantum dots may be nano three-dimensional structures including zinc, cadmium, selenium, sulfur, or a combination thereof. The grain diameter of the quantum dots may range from about 1 nm to 10 nm. By tuning the grain diameter of the quantum dot, the spectrum of light resulting from the excitation of the quantum dot film 146 by the light-emitting units 104 may be altered. For example, the quantum dot film 146 blended with the quantum dots having the first grain diameter may emit green light after excitation. The quantum dot film 146 blended with the quantum dots having the second grain diameter may emit red light after excitation. The quantum dot film 146 blended with the quantum dots having the third grain diameter may emit blue light after excitation. In some embodiments, not the quantum dot film 146 but a transparent layer is formed between two light-shielding portions.

As shown in FIG. 3F, the light filter layer 144 is formed on the quantum dot film 146 so that the quantum dot film 146 is disposed between the light filter layer 144 and the protective layer 148. The light filter layer 144 may include a blue filter layer, a red filter layer, a green filter layer or a combination thereof.

Figure 5A:
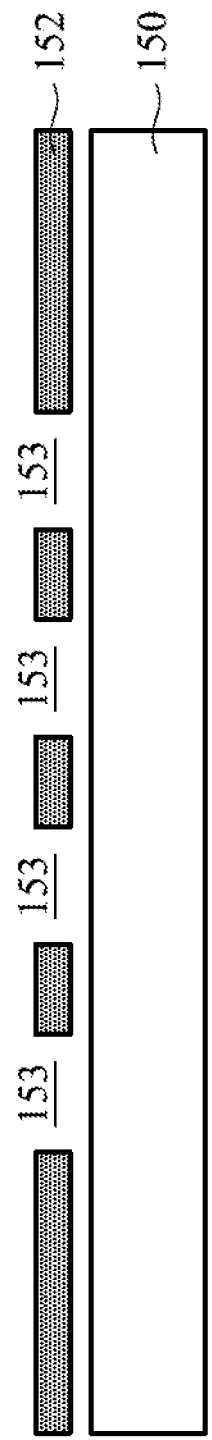
FIGS. 5A-5D are cross-sectional views of various stages of a process for manufacturing a substrate in accordance with some embodiments of the present disclosure.

Referring to FIGS. 5A-5D, FIGS. 5A-5D are cross-sectional views of various stages of a process for manufacturing a substrate 400A in accordance with some embodiments of the present disclosure. As shown in FIG. 5A, a transfer head 150 is provided. The transfer head 150 may be, but is not limited to, a glass substrate, a ceramic substrate, a plastic substrate, other transparent or nontransparent substrates. In some embodiments, the transfer head 150 is a nontransparent substrate such as a metal substrate or a graphite substrate. A mask 152 is disposed on the transfer head 150. As shown in FIG. 5A, the mask 152 has a number of openings 153. Where the transfer head 150 corresponding to the openings 153 is a region for forming an adhesive layer.

Figure 5B:
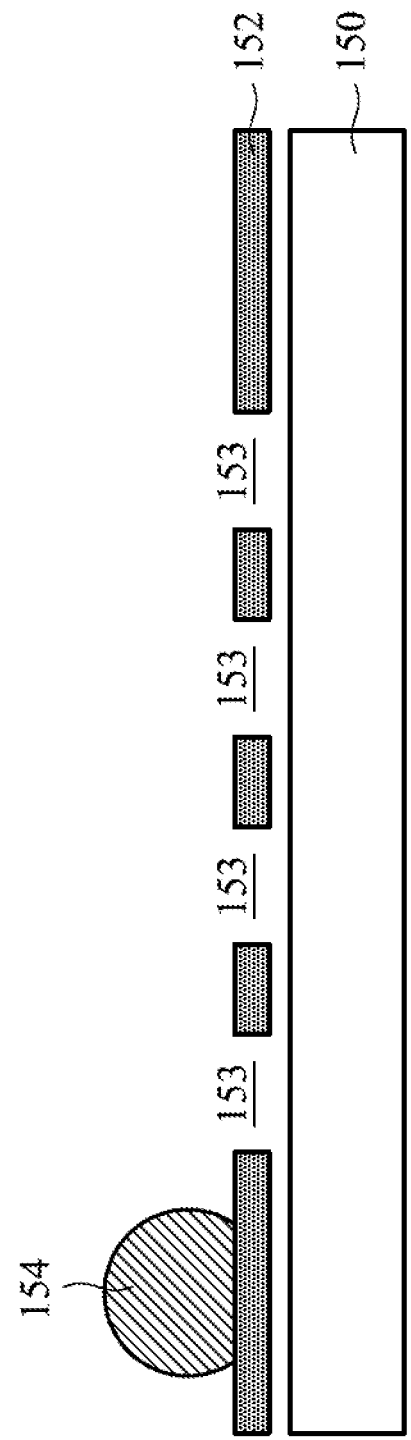

Next, as shown in FIG. 5B, an adhesive material 154 is coated on the mask 152. In some embodiments, the adhesive material 154 includes silicon or made of silicon. The adhesive material 154 may be formed on the mask 152 by an inkjet process.

Figure 5C:
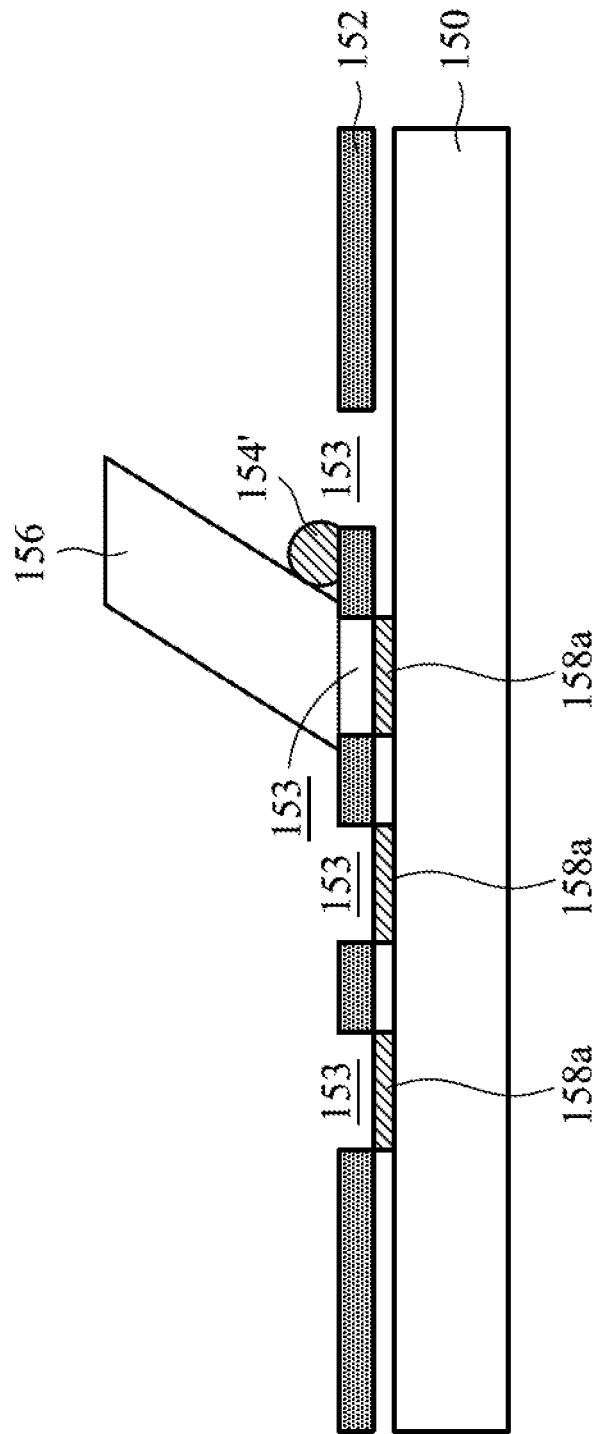

Next, as shown in FIG. 5C, a brush 156 is used to fill the openings 153 with a portion of the adhesive material 154 so that the adhesive material 154 drops on a surface of the transfer head 150, and another portion of the adhesive material 154' remains on the mask 152 in accordance with some embodiments. The portion of the adhesive material 154 dropping on the surface of the transfer head 150 forms at least one adhesive pattern 158a. The adhesive pattern 158a forms an adhesive layer. In some embodiments, after the adhesive pattern 158a is formed on the transfer head 150, the adhesive pattern 158a is cured by heating or exposure to UV or IR light.

In some embodiments, as shown in FIG. 5C, the top surface of the adhesive pattern 158a is planar. In other embodiments, at least a portion of the top surface of the adhesive pattern 158a is arch-shaped. In some embodiments, the cross-sectional of the adhesive pattern 158a is rectangular. In some embodiments, the cross-sectional of the adhesive pattern 158a is circular, oval or in other shapes.

Figure 5D:
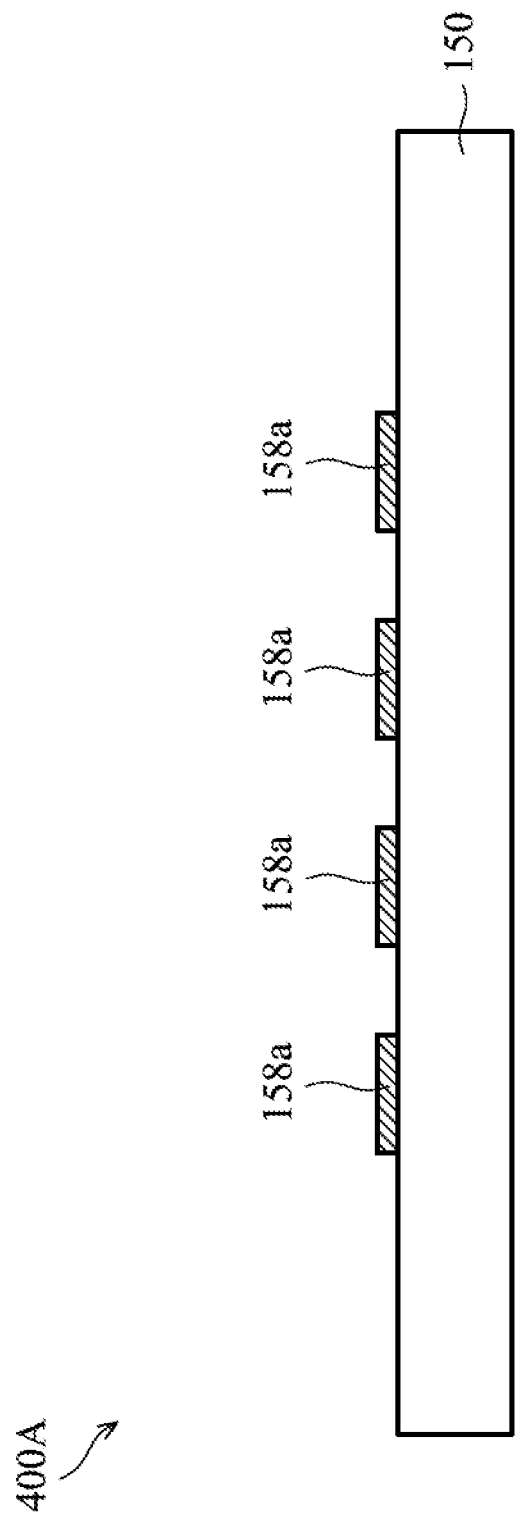

Next, as shown in FIG. 5D, the mask 152 and the brush 156 are removed, and a substrate 400A is formed in accordance with some embodiments. In some embodiments, the width of the adhesive pattern 158a is in a range from about 30 μm to about 60 μm, such as 45 μm. For example, the width of the adhesive pattern 158a means a maximum value measured along a direction parallel to the top surface of the transfer head 150. The height of the adhesive pattern 158a is in a range from about 5 μm to about 15 μm. In some embodiments, before the adhesive pattern 158a is formed, a planar layer may form on the top surface of the transfer head 150. Next, the adhesive pattern 158a is formed on the planar layer according to the above steps.

Figure 6A:
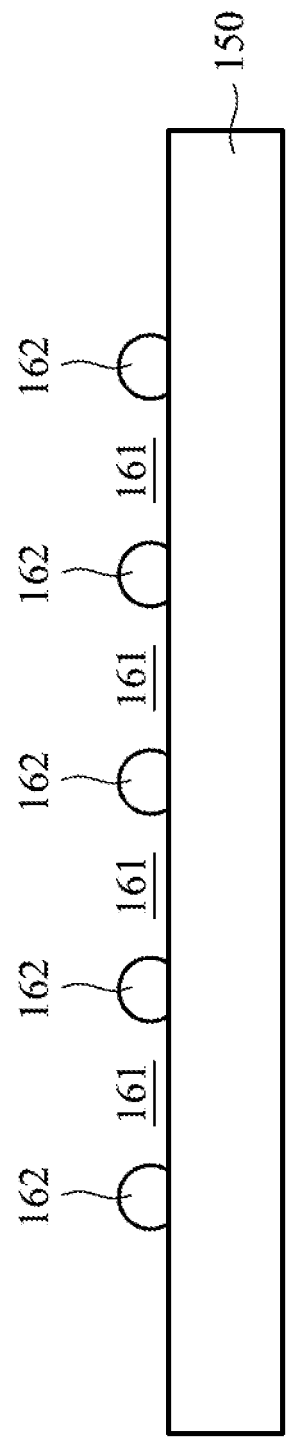
FIGS. 6A-6D are cross-sectional views of various stages of a process for manufacturing a substrate in accordance with some embodiments of the present disclosure.

Referring to FIGS. 6A-6D, FIGS. 6A-6D are cross-sectional views of various stages of a process for manufacturing a substrate 400B in accordance with some embodiments of the present disclosure. In some embodiments, a number of spacer patterns 162 are formed on the transfer head 150, as shown in FIG. 6A. The spacer patterns 162 can be regarded as a spacer layer. As shown in FIG. 6A, there are openings 161 between two adjacent spacer patterns 162. In some embodiments, the spacer layer (the spacer patterns 162) is a connected structure with net shape, and has multiple openings 161. The spacer pattern 162 may also be arranged separately. In some embodiments, the spacer patterns 162 include an insulating material such as photoresist. In some embodiments, a photoresist layer is coated on the transfer head 150 and then patterned to form the spacer patterns 162 by a lithography process and an etching process.

Figure 6B:
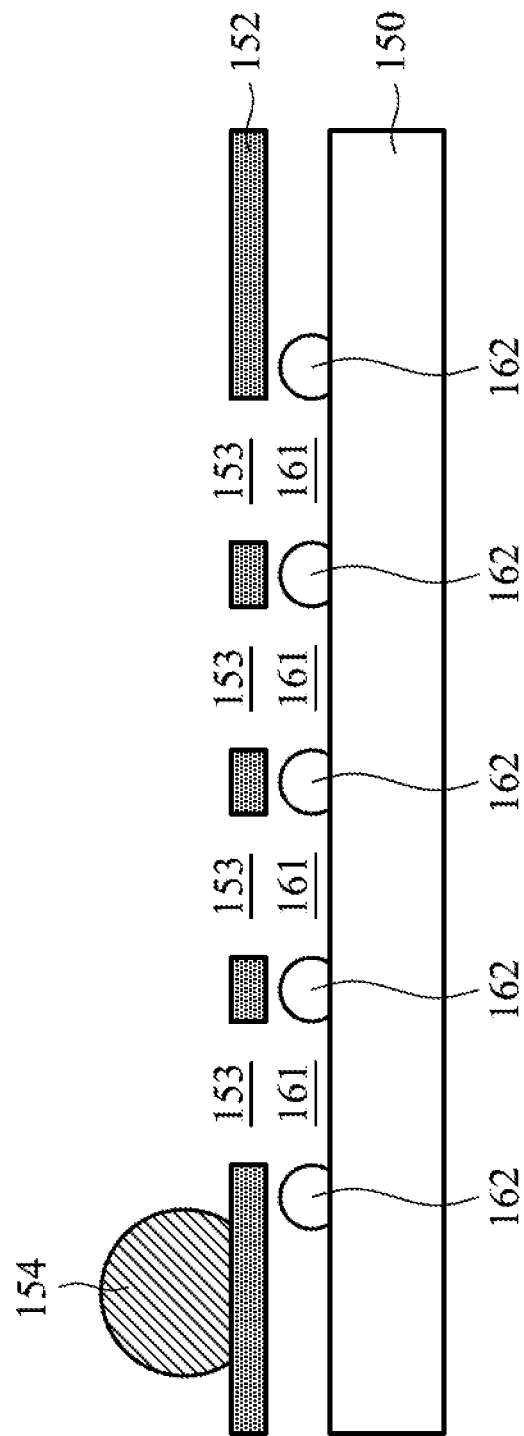

As shown in FIG. 6B, the mask 152 is disposed over the transfer head 150 where the mask 152 has a number of openings 153 in accordance with some embodiments. The openings 153 overlap the openings 161, and the mask 152 covers the spacer patterns 162. Next, the adhesive material 154 is coated on the mask 152 as shown in FIG. 6B. In some embodiments, the adhesive material 154 includes silicon or made of silicon. The adhesive material 154 may be formed on the mask 152 by an inkjet process.

Figure 6C:
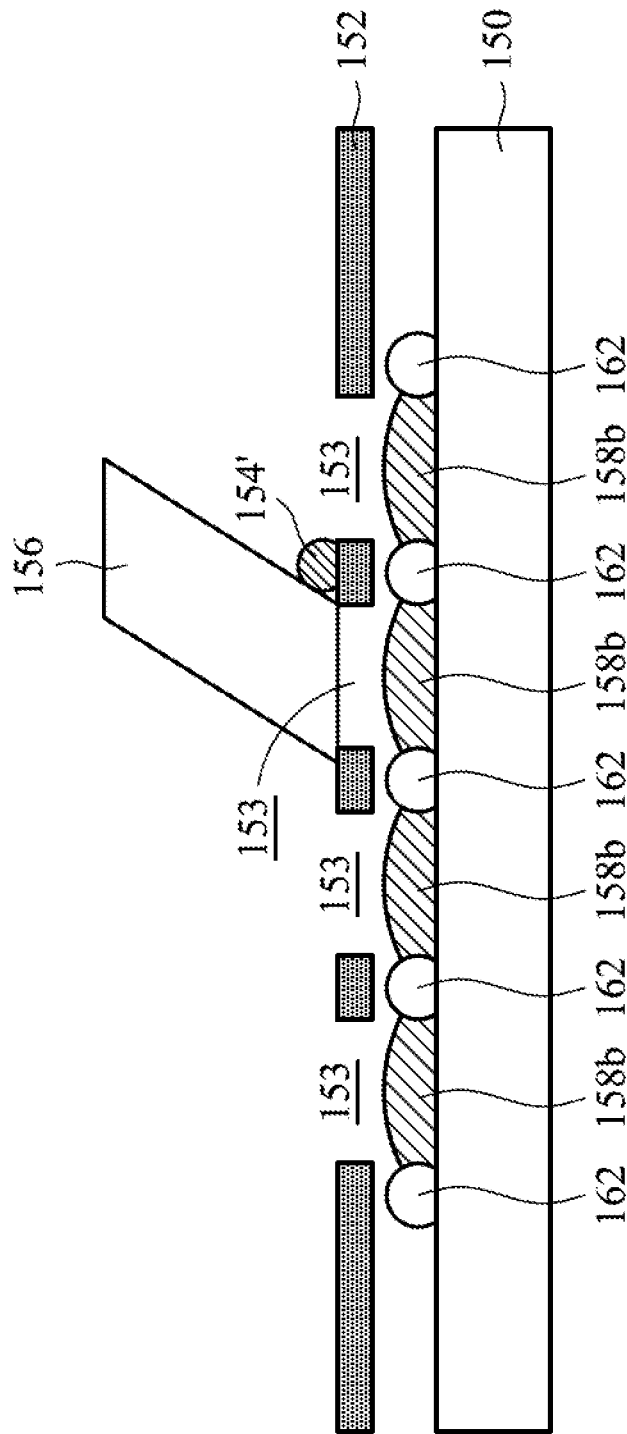

Next, as shown in FIG. 6C, the brush 156 is used to allow the adhesive material 154 to drop on the surface of the transfer head 150, and another portion of the adhesive material 154' remains on the mask 152 in accordance with some embodiments. The portion of the adhesive material 154 dropping on the surface of the transfer head 150 forms at least one adhesive pattern 158b. The at least one adhesive pattern 158b forms an adhesive layer. In some embodiments, after the adhesive pattern 158b is formed on the transfer head 150, the adhesive pattern 158b is cured by heating or exposure to UV or IR light. In other embodiments, at least a portion of the top surface of the adhesive pattern 158b is arch-shaped. In addition, the adhesive patterns 158b are formed between two adjacent spacer patterns 162 and surrounded by the spacer patterns 162.

Figure 6D:
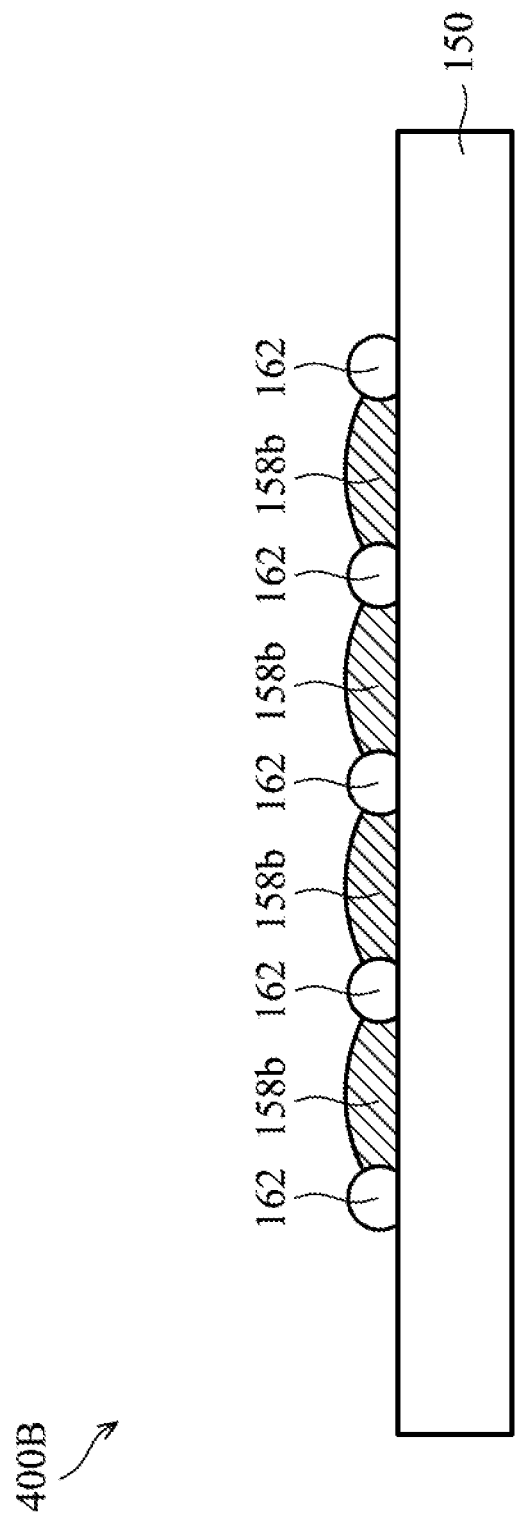

Next, as shown in FIG. 6D, the mask 152 and the brush 156 are removed, and a substrate 400B is formed in accordance with some embodiments. In some embodiments, the width of the adhesive pattern 158b is in a range from about 30 μm to about 70 μm, such as 50 μm. The height of the adhesive pattern 158b is in a range from about 5 μm to about 15 μm, such as 10 μm. In some embodiments, the height of the adhesive pattern 158b is greater than that of the spacer pattern 162. Variations and/or modifications can be made to embodiments of the disclosure. In some embodiments, the height of the adhesive pattern 158b is smaller than that of the spacer pattern 162.

Figure 7A:
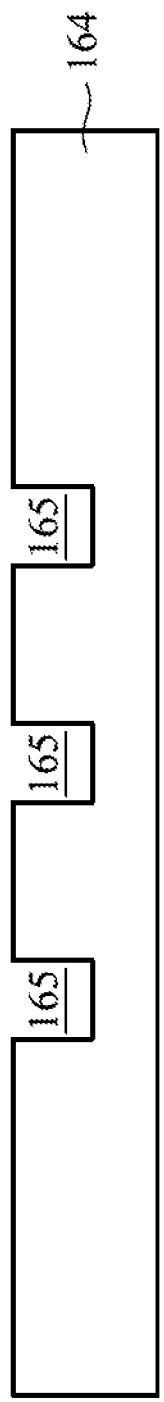
FIGS. 7A-7D are cross-sectional views of various stages of a process for manufacturing a substrate in accordance with some embodiments of the present disclosure.

Referring to FIGS. 7A-7D, FIGS. 7A-7D are cross-sectional views of various stages of a process for manufacturing a substrate 400C in accordance with some embodiments of the present disclosure. In some embodiments, a substrate 164 is provided as shown in FIG. 7A. In some embodiments, the substrate 164 is a silicon wafer or glass. As shown in FIG. 7A, the substrate 164 has a number of recesses 165. In some embodiments, a photoresist layer (not shown) is coated on the substrate 164 and then patterned to expose a portion of the substrate 164 by a lithography process. Next, an etching process is performed to remove the portion not covered by the photoresist layer, and the recesses 165 are formed. Further, the photoresist layer is removed. In some embodiments, the depth of the recess 165 is in a range from about 5 μm to about 15 μm, such as 10 μm.

Figure 7B:
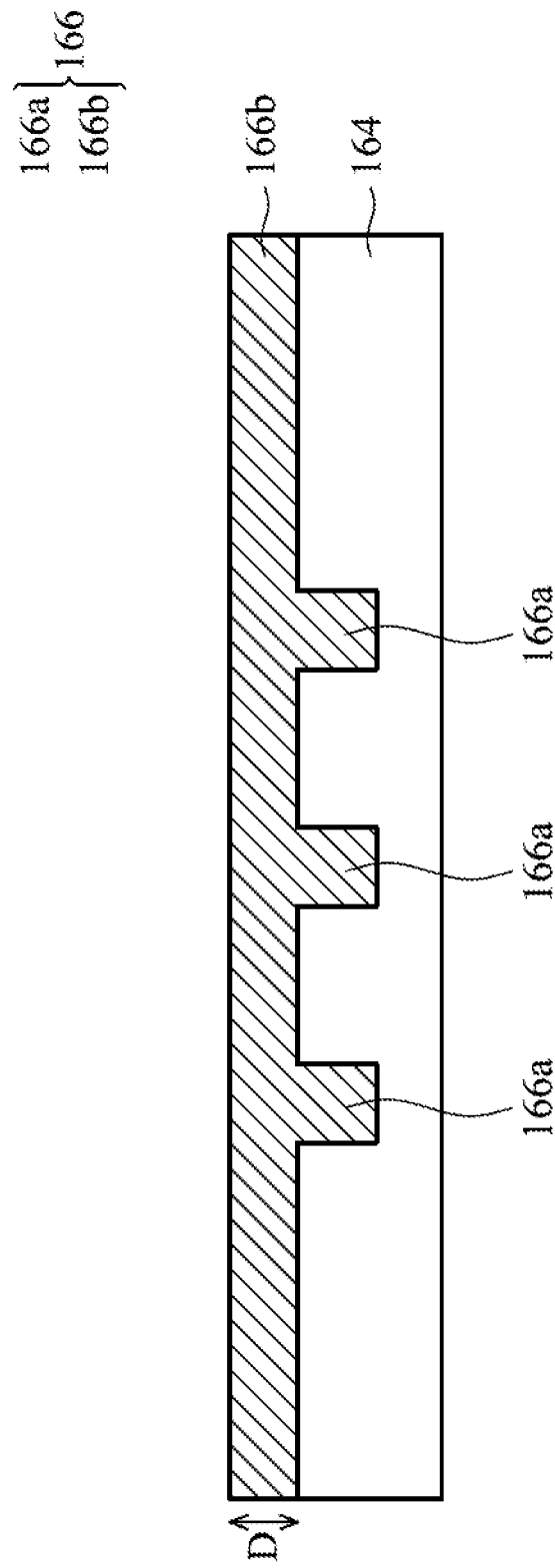

As shown in FIG. 7B, the adhesive layer 166 is coated on the substrate 164 and fills into the recess 165 to form adhesive layer 166 in accordance with some embodiments. The adhesive layer 166 includes protruding portions 166a and a bottom layer 166b formed on the protruding portions 166a. In some embodiments, the thickness D of the bottom layer 166b of the adhesive layer 166 is in a range from about 60 μm to about 600 μm, such as 150 μm or 300 μm. In some embodiments, the adhesive layer 166 includes silicon or made of silicon. The adhesive layer 166 may be formed on the substrate 164 by an inkjet process.

Figure 7C:
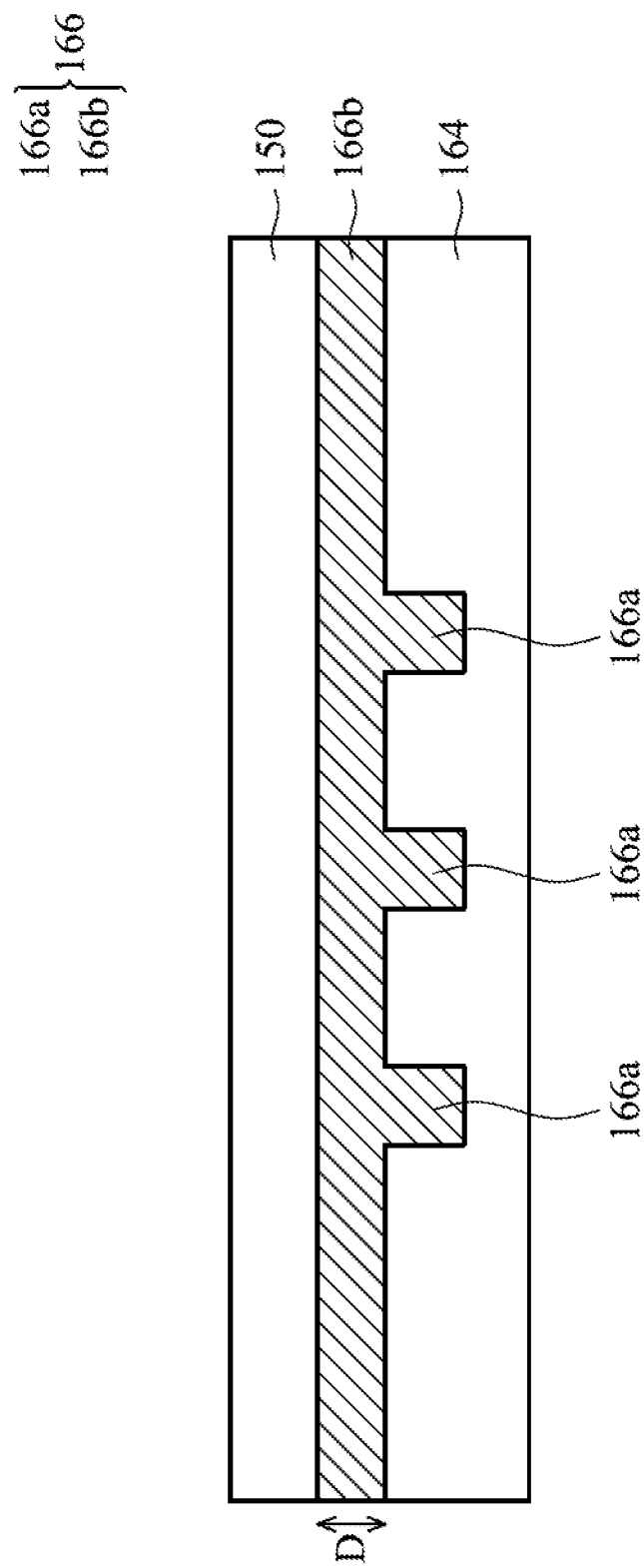

In some embodiments, as shown in FIG. 7C, the transfer head 150 is disposed on a surface of the adhesive layer 166 where the protruding portions 166a are not formed, and the adhesive layer 166 is covered by the transfer head 150. Next, the adhesive layer 166 is cured by heating or exposure to UV or IR light.

Figure 7D:
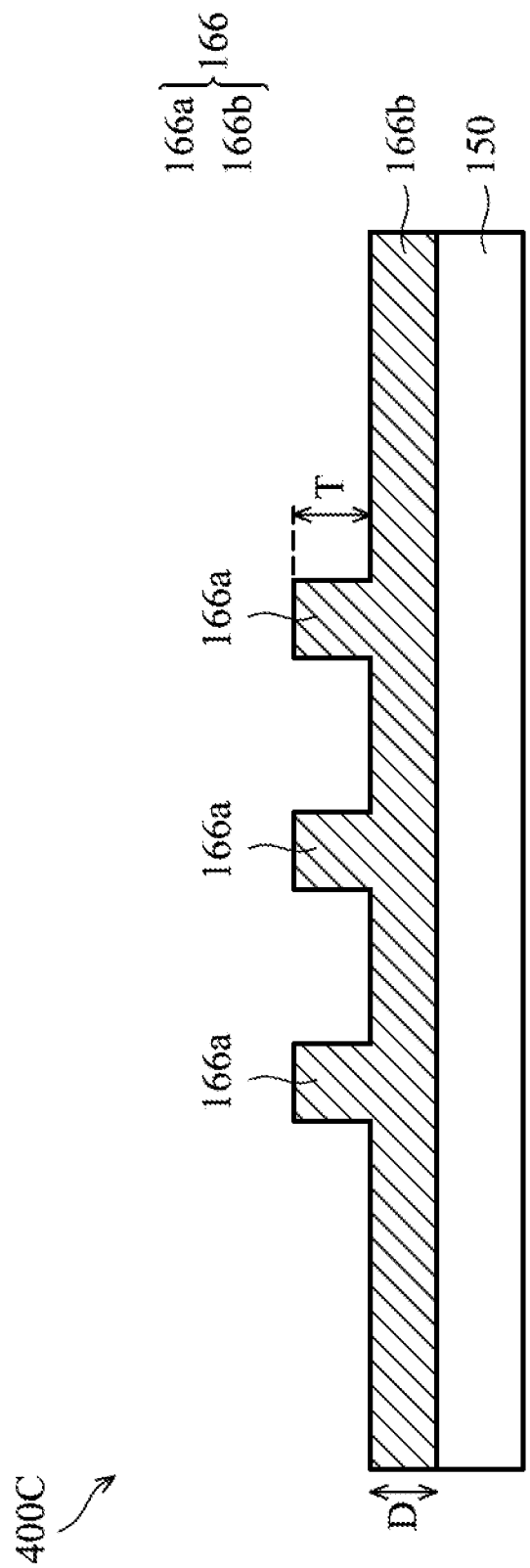

Next, as shown in FIG. 7D, the substrate 164 is removed, and a substrate 400C is formed in accordance with some embodiments. As shown in FIG. 7D, the protruding portions 166a protrude from the surface of the adhesive layer 166. In some embodiments, the height T of the protruding portion 166a is in a range from about 5 μm to about 15 μm, such as 10 μm. In some embodiments, the protruding portions 166a are used to attach the light-emitting units.

Figure 8A:
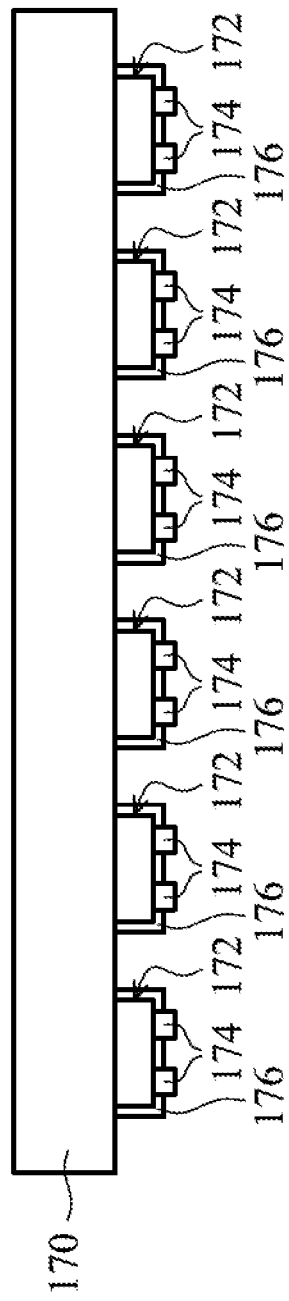
FIGS. 8A-8E are cross-sectional views of various stages of a process for manufacturing a display device in accordance with some embodiments of the present disclosure.

Referring to FIGS. 8A-8E, FIGS. 8A-8E are cross-sectional views of various stages of a process for manufacturing a display device 100B in accordance with some embodiments of the present disclosure. As shown in FIG. 8A, a transfer head 170 is provided. In some embodiments, the transfer head 170 is a wafer such as a sapphire substrate which includes alumina oxide and gallium nitride formed thereon. It is noted that the transfer head 170 shown in FIG. 8A is merely an example, and the present disclosure is not be intended to be limited. Other elements may be formed on the transfer head 170, such as an adhesive pattern or an adhesive layer.

As shown in FIG. 8A, a plurality of light-emitting units 172 are disposed on the transfer head 170. In some embodiments, the structure of the light-emitting units 172 may be the same as or similar to that of the light-emitting units 104 shown in FIG. 2. In addition, bonding pads 174 are formed on the light-emitting units 172. The bonding pad 174 is configured to attach the light-emitting units 172 to other electronic elements or a substrate having electronic elements. The material of the bonding pad 174 may include, but is not limited to, silver, copper, aluminum, tungsten, gold, chromium, nickel, platinum, titanium, iridium, rhodium, the above alloys, the above combination or any other conductive materials. As shown in FIG. 8A, a support layer 176 is formed on a surface of the transfer head 170 and covers the outer surface of the light-emitting units 172 and a portion of sidewalls of the bonding pad 174. The support layer 176 is configured to decrease the chance of breaking the semiconductor layer of the light-emitting units 172 due to the high temperature of the subsequent bonding process.

Figure 8B:
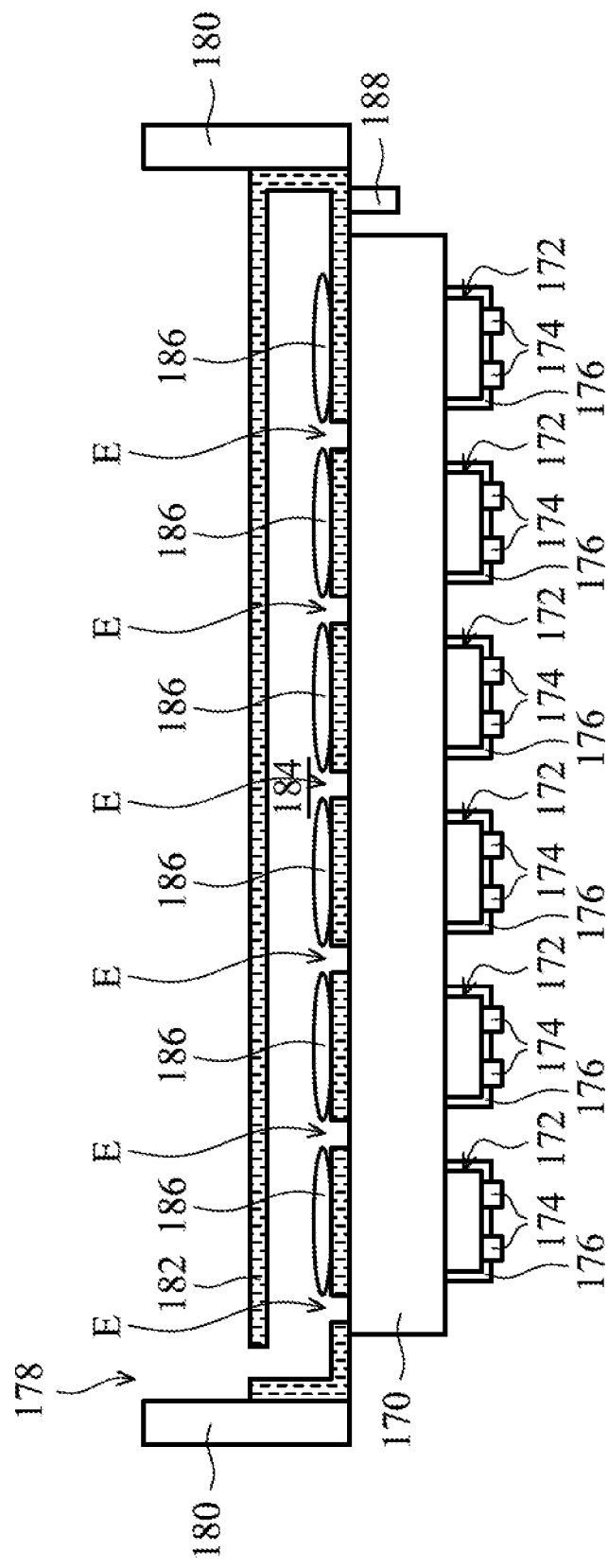

In some embodiments, as shown in FIG. 8B, the transfer head 170 and the light-emitting units 172 disposed on the transfer head 170 are transferred by a pick-up device 178. As shown in FIG. 8B, the pick-up device 178 includes a joint handle 180 which is used to fix a platform 182 and elements formed on the platform 182. The platform 182 may include quartz or other applicable materials. As shown in FIG. 8B, the platform 182 has a number of openings E to expose the transfer head 170. In some embodiments, the transfer head 170 is attached to the pick-up device 178 by making space 184 be in a vacuum state. In addition, a number of micro lenses 186 are disposed in the space 184, and the locations where the micro lenses 186 are disposed correspond to the light-emitting units 172, respectively. Further, the pick-up device 178 includes an alignment mark 188. The alignment mark 188 enables the light-emitting units 172 and the bonding pad 174 to be bonded in the correct place in subsequent process.

Figure 8C:
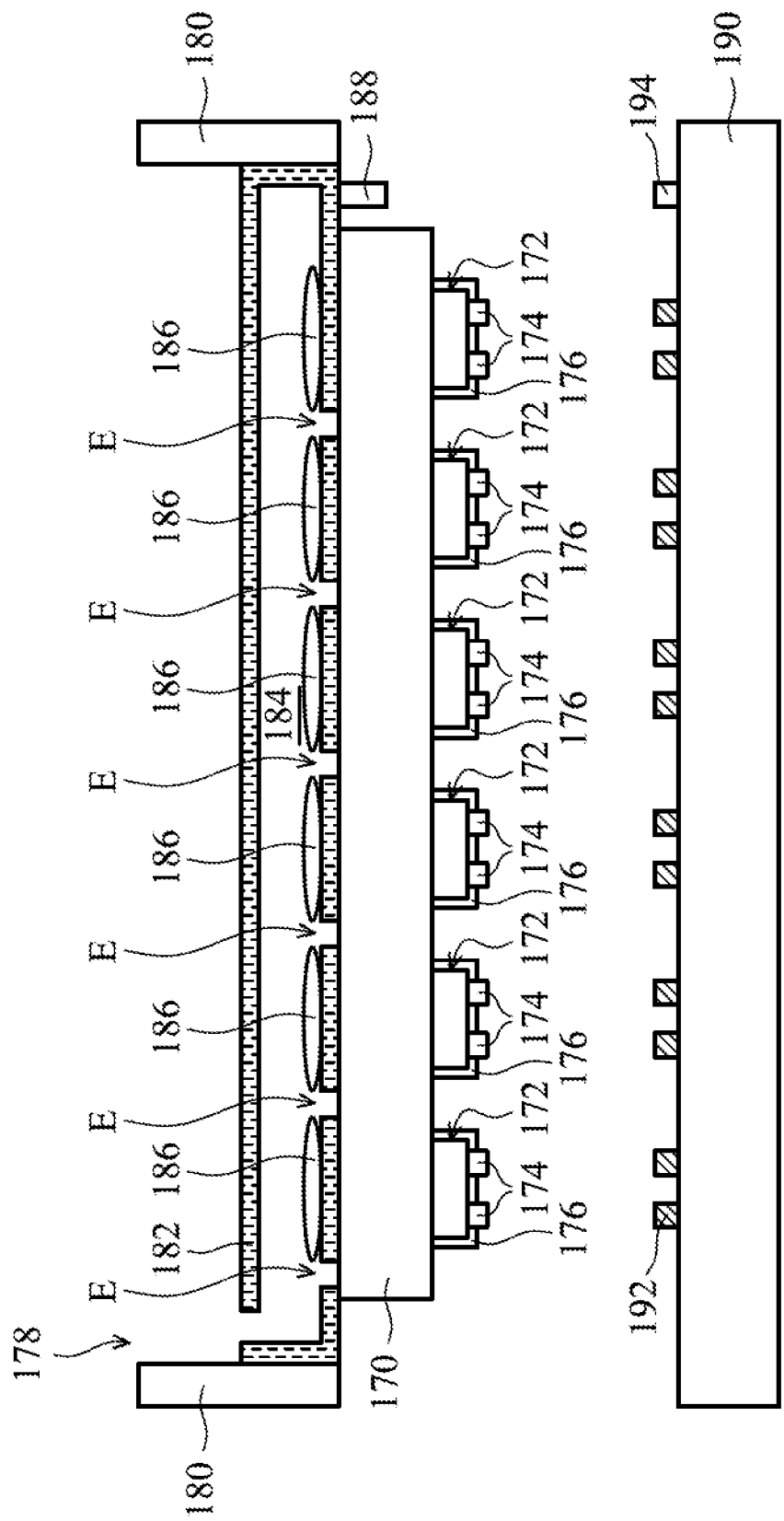

As shown in FIG. 8C, a substrate 190 is provided. In some embodiments, the substrate 190 is a backplate of the display device to dispose the light-emitting units 172. In some embodiments, the substrate 190 includes a glass substrate, a ceramic substrate, a plastic substrate or another applicable substrate. In some embodiments, the front surface of the substrate 190 is a surface where the light-emitting units 172 are disposed. In some embodiments, a semiconductor element layer (not shown) is formed on the back surface of the substrate 190. The semiconductor element layer includes an integrated circuit (IC). The IC may include, but is not limited to, a micro-processor, a memory element and/or other elements. The IC may also include various passive and active microelectronic devices, such as thin film resistors, conductive wires or other elements. In some embodiments, bonding pads 192 are formed on the substrate 190. The material of the bonding pad 192 may be an alloy with low melting point. In some embodiments, the bonding pad 192 is a eutectic material having melting point smaller than 300° C. The material of the bonding pad 192 may include, but is not limited to, a tin-indium alloy, a tin-zinc alloy, a tin-silver alloy, a gold-indium alloy, a gold-tin alloy or other suitable materials. In some embodiments, the bonding pad 192 may be a multilayer stack structure, such as a copper/nickel/gold structure or a nickel/platinum/gold structure. In some embodiments, the substrate 190 includes an alignment mark 194. The bonding pads 174 on the light-emitting units 172 are bonded to the corresponding bonding pads 192 by aligning the alignment mark 194 with the alignment mark 188 in the subsequent bonding process.

Figure 8D:
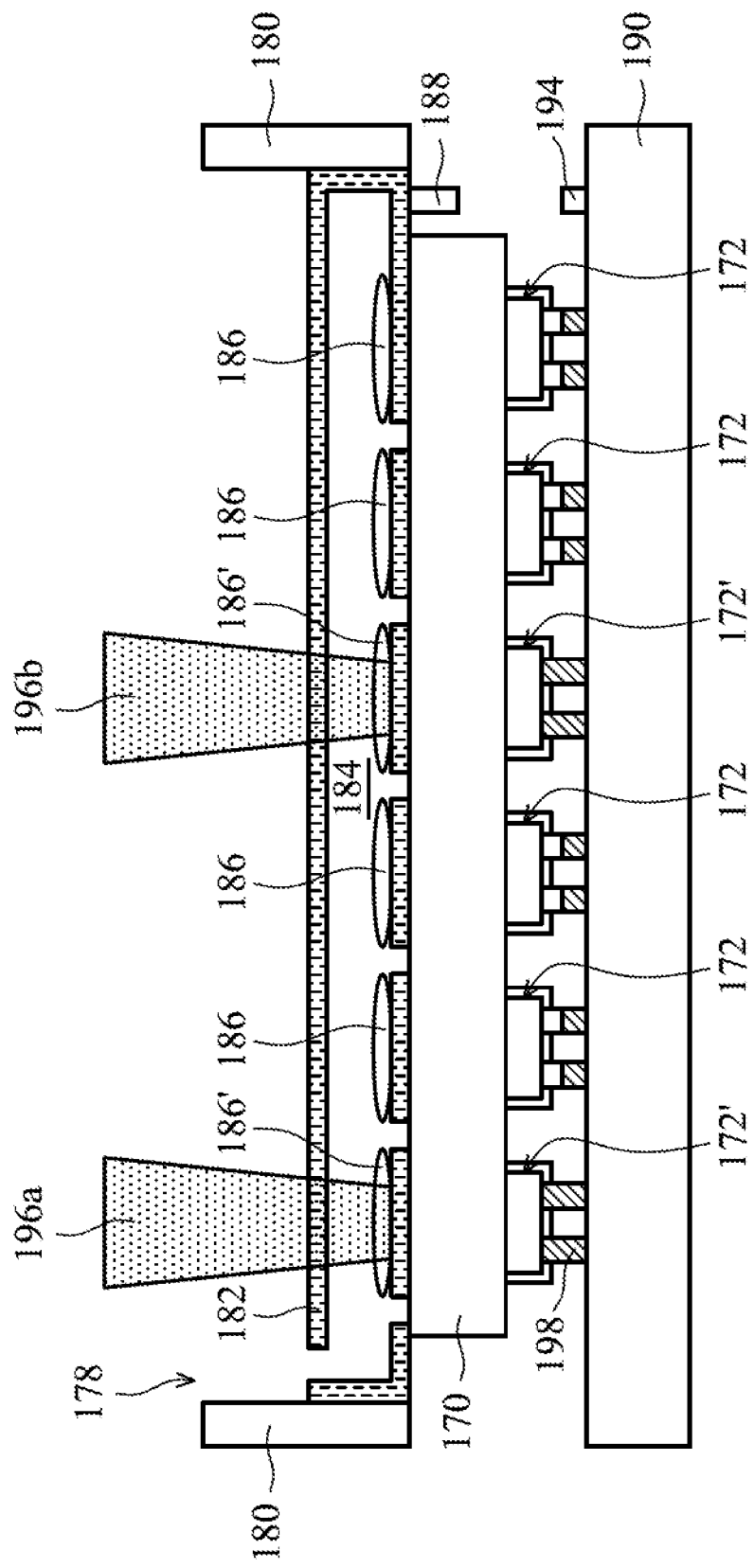

In some embodiments, as shown in FIG. 8D, a bonding process is performed. The alignment mark 194 is aligned with the alignment mark 188, and the bonding pad 174 on the light-emitting units 172 are bonded to the corresponding bonding pad 192. In some embodiments, the bonding process includes a laser lift off (LLO) process or other applicable process. In some embodiments, as shown in FIG. 8D, the light 196a and/or the light 196b are projected onto at least one of the micro lenses 186'. The bonding pads 174 on the light-emitting units 172' corresponding to the micro lens 186' and the bonding pads 192 form an alloy 198 due to heat. As shown in FIG. 8A, the bonding pads 174 on the light-emitting units 172 not projected by the light and the bonding pad 192 do not form the alloy. In some embodiments, the light 196a and the light 196b include KrF excimer laser with wavelength 248 nm or other applicable light source. In some embodiments, the light 196a and the light 196b may be projected onto the micro lens 186' simultaneously. In some embodiments, the light 196a and the light 196b may be projected onto the micro lens 186' in different steps. In some embodiments, the micro lens 186' has a function of optical modulation. It is noted that a person skilled in the art could realize that the micro lens 186' may include one or more lenses.

Figure 8E:
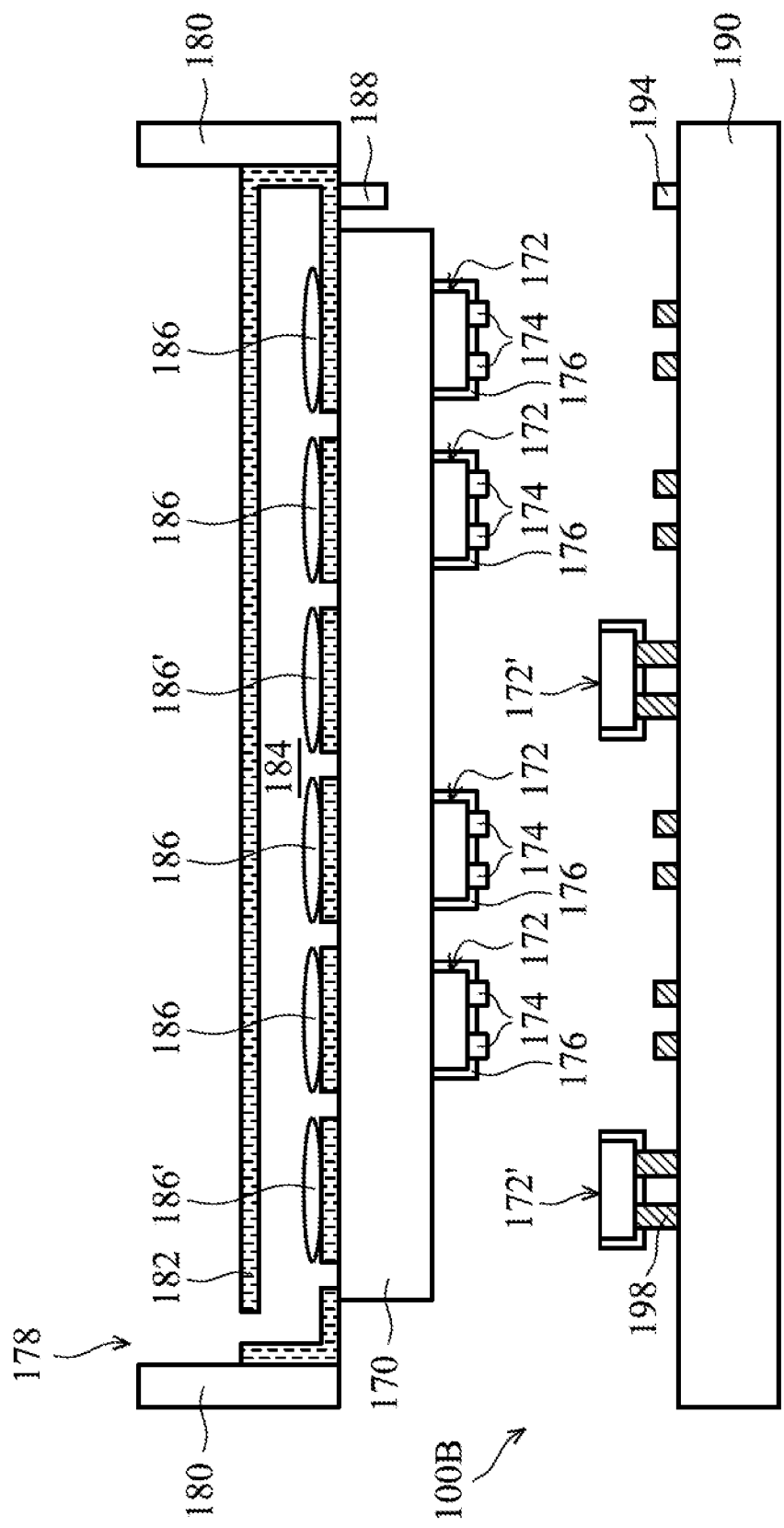

In some embodiments, as shown in FIG. 8E, the pick-up device 178 is removed from the substrate 190, and a display device 100B is formed. As shown in FIG. 8E, the light-emitting units 172' are attached to the substrate 190, and the light-emitting units 172 are not attached to the substrate 190. By projecting the light onto a portion of the light-emitting units (e.g. the light-emitting units 172'), the light-emitting units can be transferred selectively from the transfer head 170 to the substrate 190.

Figure 9A:
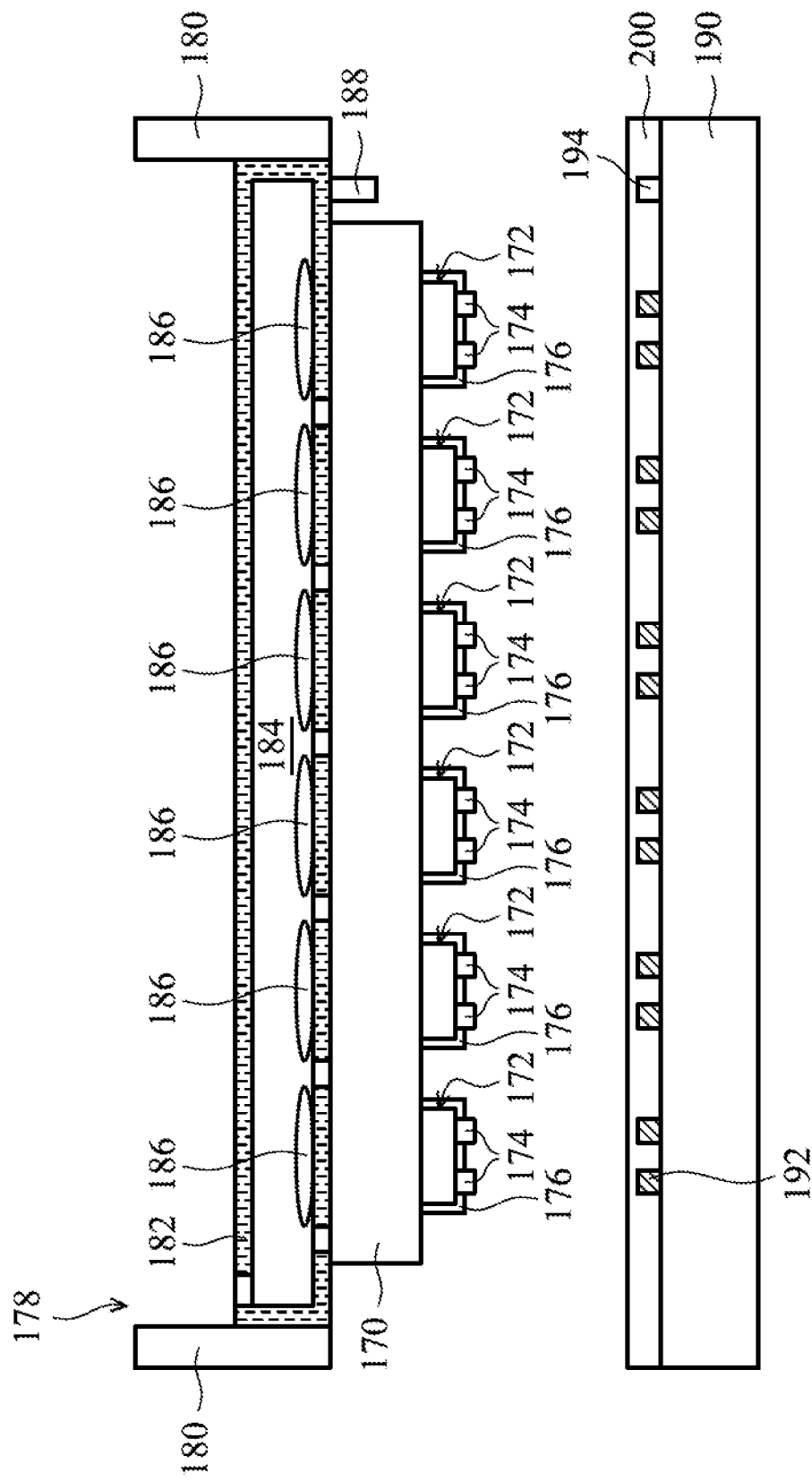
FIGS. 9A and 9B are cross-sectional views of various stages of a process for manufacturing a display device in accordance with some embodiments of the present disclosure.
Figure 9B:
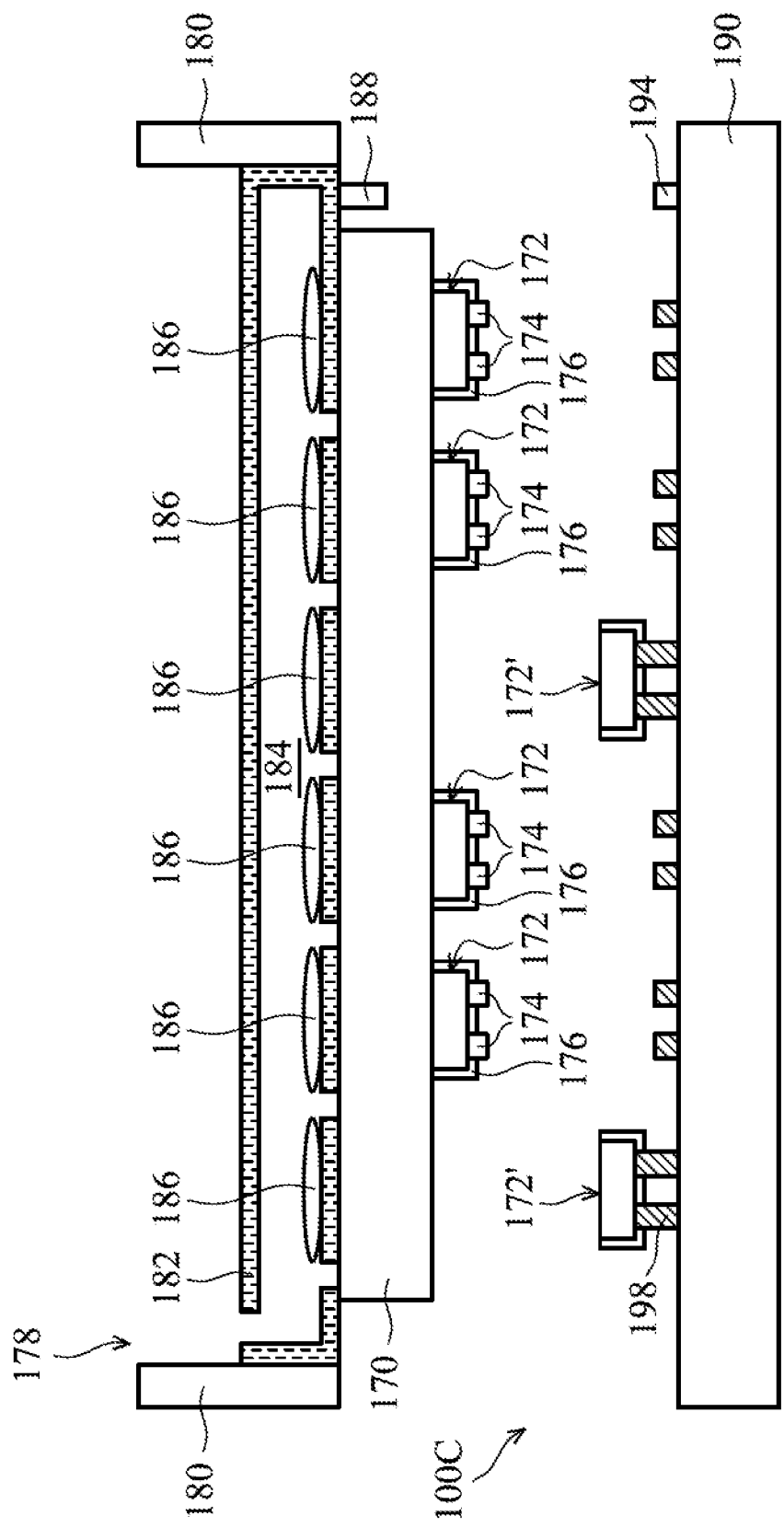

Referring to FIGS. 9A and 9B, FIGS. 9A and 9B are cross-sectional views of various stages of a process for manufacturing a display device 100C in accordance with some embodiments of the present disclosure. As shown in FIG. 9A, before a bonding process is performed, a capping layer 200 is formed to cover the top surface of the substrate 190, the bonding pads 192 and the alignment mark 194, in accordance with some embodiments. In some embodiments, the capping layer 200 includes a non-conductive film (NCF), an anisotropic conductive film (ACF) or other materials. The capping layer 200 may be formed by a coating process, an inkjet process or other suitable process. The capping layer 200 may be cured by heat or exposure of light in the subsequent bonding process. Therefore, the light-emitting units 172' can be easier to bond to the bonding pad 192 of the substrate 190. As a result, the light-emitting units 172 and the bonding pad 192 form the alloy 198. In some embodiments, the capping layer 200 is patterned. The patterned capping layer 200 covers the top surface and side surfaces of the bonding pad 192 and does not cover the top surface of the substrate 190 completely.

Next, a bonding process is performed in accordance with some embodiments. The light is projected onto a portion of the light-emitting units (e.g. the light-emitting units 172'). Next, the pick-up device 178 and the capping layer 200 are removed, and a display device 100C shown in FIG. 9B is created. In some embodiments, a portion of the capping layer 200 remains on the display device 100C. In some embodiments, the processes from FIG. 9A to FIG. 9B are the same as or similar to those shown from FIG. 8C to FIG. 8E, and are not repeated herein.

Figure 10A:
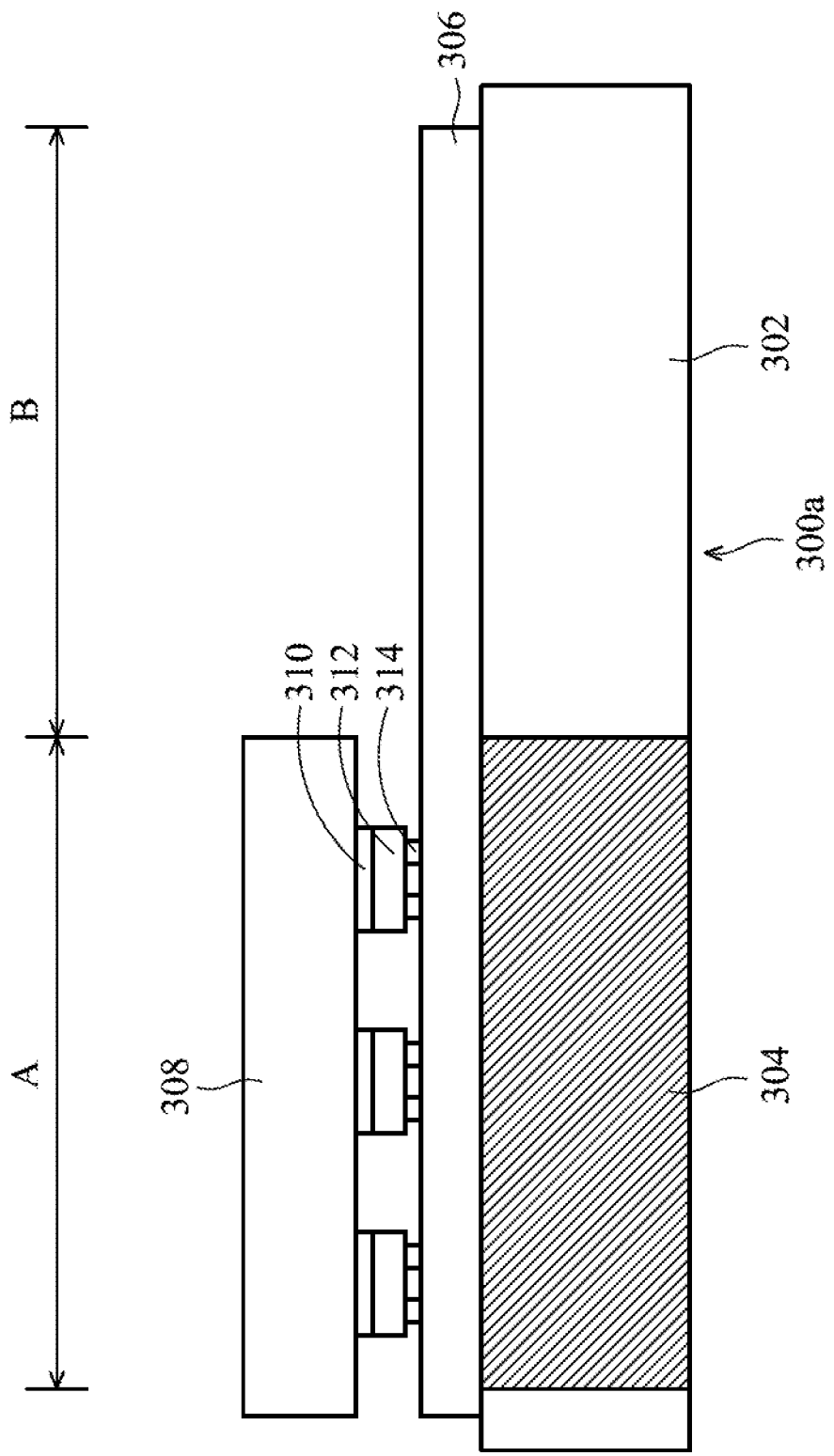
FIGS. 10A-10C are cross-sectional views of various stages of a process for manufacturing a display device in accordance with some embodiments of the present disclosure.
Figure 10B:
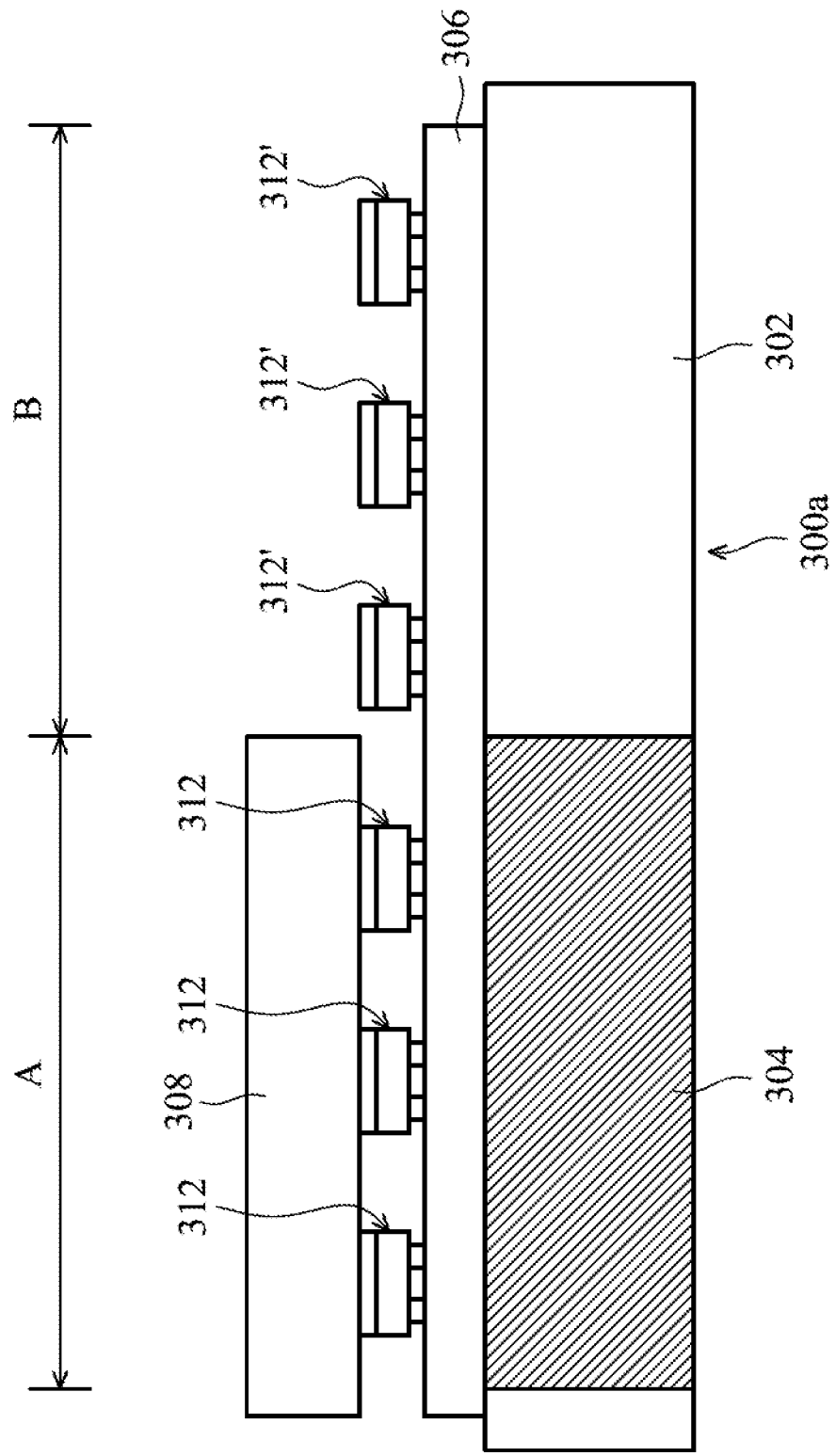
Figure 10C:
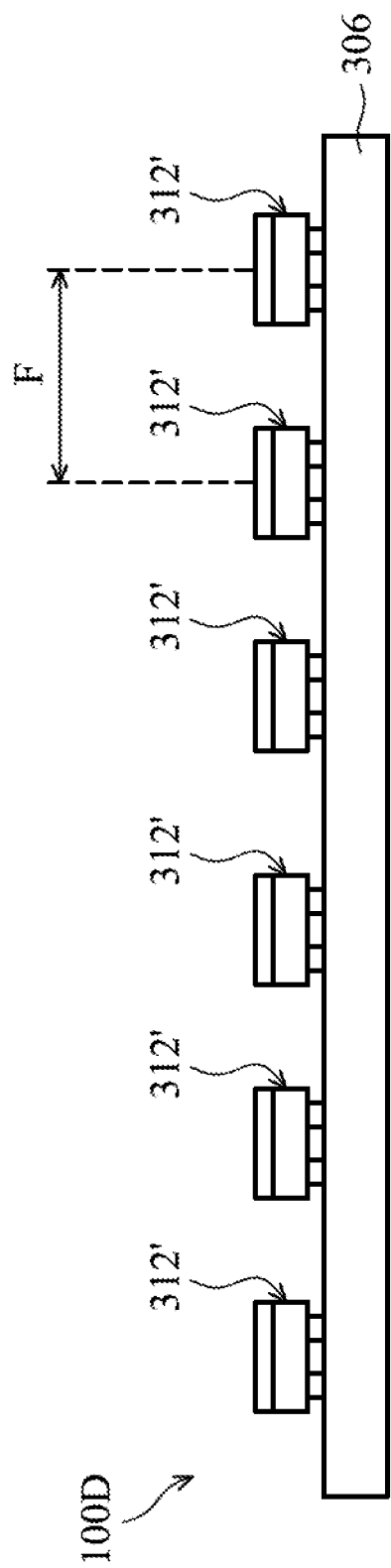

Referring to FIGS. 10A-10C, FIGS. 10A-10C are cross-sectional views of various stages of a process for manufacturing a display device 100D in accordance with some embodiments of the present disclosure. As shown in FIG. 10A, a heat plate 300a is provided. As shown in FIG. 10A, the heat plate 300a includes a thermal isolation part 302 and a thermal conductive part 304. In some embodiments, the thermal isolation part 302 includes thermal insulation material, and the thermal conductive part 304 includes, but is not limited to, thermal conductive material. The material of the thermal isolation part 302 may include glass, plastic or other material. The material of the thermal conductive part 304 may include, but is not limited to, silver, copper, aluminum, tungsten, gold, chromium, nickel, platinum, titanium, iridium, rhodium, the above alloys, the above combination or any other conductive materials.

As shown in FIG. 10A, a substrate 306 is put on the heat plate 300a. In some embodiments, the substrate 306 is a backplate where light-emitting units 312 are disposed. In some embodiments, the front surface of the substrate 306 is a surface where the light-emitting units 172 are disposed. In some embodiments, a semiconductor element layer (not shown) is formed on the back surface of the substrate 306. The semiconductor element layer includes an integrated circuit (IC). The IC may include, but is not limited to, a micro-processor, a memory element and/or other elements. The IC may also include various passive and active microelectronic devices, such as thin film resistors, conductive wires or other elements. It is noted that the substrate 306 shown in FIG. 10A is merely an example, and the present disclosure is not limited thereto. The substrate 306 may include other elements. In some embodiments, the substrate 306 includes a region A and a region B. As shown in FIG. 10A, the region A is located over the thermal conductive part 304, and the region B is located on the thermal isolation part 302. The thermal isolation part 302 is adjacent to or surrounded the thermal conductive part 304.

As shown in FIG. 10A, the transfer head 308 and the light-emitting units 312 on the transfer head 308 are put on the substrate 306. The transfer head 308 may be a transparent substrate, a metal substrate or a graphite substrate. The transparent substrate includes a glass substrate, a ceramic substrate, a plastic substrate, a sapphire substrate or another applicable transparent substrate. The transfer head 308 may be used as a carrier substrate, and the light-emitting units 312 are removed from the transfer head 308 in the subsequent process.

In some embodiments, the light-emitting units 312 are attached to the transfer head 308 by an adhesive layer 310, as shown in FIG. 10A. In some embodiments, the material of the adhesive layer 310 may include, but is not limited to, OCA, OCR or other applicable transparent material. In some embodiments, the adhesive layer 310 is an adhesive material including silicon. In some embodiments, the adhesive layer 310 is formed on the transfer head 308 by inkjet process. In some embodiments, the light-emitting units 312 is attached to the transfer head 308 by other pick-up mechanism such as a vacuum suction force, a magnetic force or a static electricity force.

As shown in FIG. 10A, the bonding pads 314 are formed on the light-emitting units 312, and the light-emitting units 312 are attached to the substrate 306 through the bonding pad 314. The material of the bonding pad 314 may include, but is not limited to, silver, copper, aluminum, tungsten, gold, chromium, nickel, platinum, titanium, iridium, rhodium, the above alloys, the above combination or any other conductive materials.

In some embodiments, the light-emitting units 312 are disposed on the region A of the substrate 306. Namely, the light-emitting units 312 are disposed on the thermal conductive part 304. In some embodiments, a heating process is performed so that the light-emitting units 312 are bonded to the substrate 306. During the heating process, the temperature of the thermal conductive part 304 is in a range from about 50° C. to about substrate 400° C., such as 200° C. or 300° C. In addition, the temperature of the thermal isolation part 302 is in a range from about 20° C. to about display device 100° C. In some embodiments, during the heating process, the region A of the substrate 306 is heated, and the region B is not heated. In some embodiments, during the heating process, the temperature of the region A is greater than that of the region B. For example, a difference between the temperature of the region A and the temperature of the region B is in a range from about 50° C. to about 350° C., such as 100° C. or 200° C. In some embodiments, the transfer head 308 and the thermal conductive part 304 are heated together, and the temperature of the transfer head 308 also increases. The temperature of the transfer head 308 is in a range from about 100° C. to about substrate 400° C., such as 200° C. or 300° C. during the heating process.

In some embodiments, by rotating or moving the substrate 306, the light-emitting units 312' which are already bonded to the substrate 306 are shifted to on the thermal isolation part 302. Next, the light-emitting units 312 not attached to the substrate 306 are put on the region A of the substrate 306. Next, a heating process is performed. As shown in FIG. 10B, the light-emitting units 312' already bonded to the substrate 306 are not heated. Therefore, it decreases the chance of lifting off the light-emitting units 312' from the substrate 306 due to being heated repeatedly.

In some embodiments, as shown in FIG. 10C, after the light-emitting units 312' are transferred from the transfer head 308 to the substrate 306, the heat plate 300a is removed, and a display device 100D is formed. By the method mentioned above, it decreases the chance of lifting off the light-emitting units 312' from the substrate 306 due to being heated repeatedly. Therefore, the yield for manufacturing the display device is increased.

Figure 11:
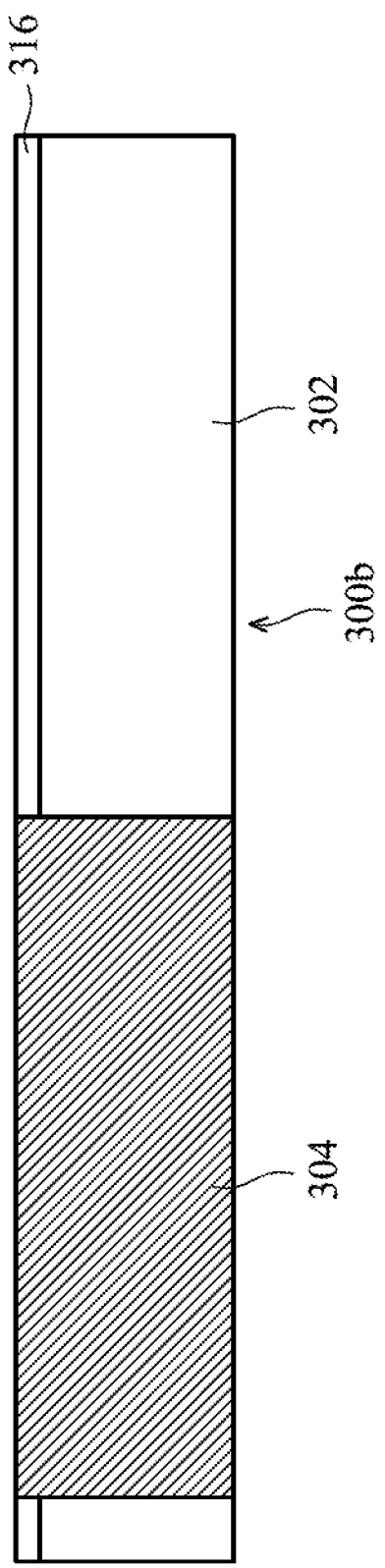
FIG. 11 is a cross-sectional view of a heat plate in accordance with some embodiments of the present disclosure.

Referring to FIG. 11, FIG. 11 is a cross-sectional view of a heat plate 300b in accordance with some embodiments of the present disclosure. In some embodiments, the heat plate 300b includes a buffer layer 316 as shown in FIG. 11. The buffer layer 316 covers the top surface of the thermal isolation part 302 and a portion of sidewalls of the thermal conductive part 304. In some embodiments, the material of the buffer layer 316 includes thermal isolation material. The thermal isolation material includes silicon, polyethylene terephthalate (PET), epoxy or a combination thereof. In some embodiments, heat transfer coefficient of the thermal isolation material is in a range from about 0.03 W/mK to about 0.17 W/mK. The function of thermal isolation is improved by disposing the buffer layer 316, and it decreases the chance of lifting off the light-emitting units from the substrate due to being heated repeatedly.

Figure 12:
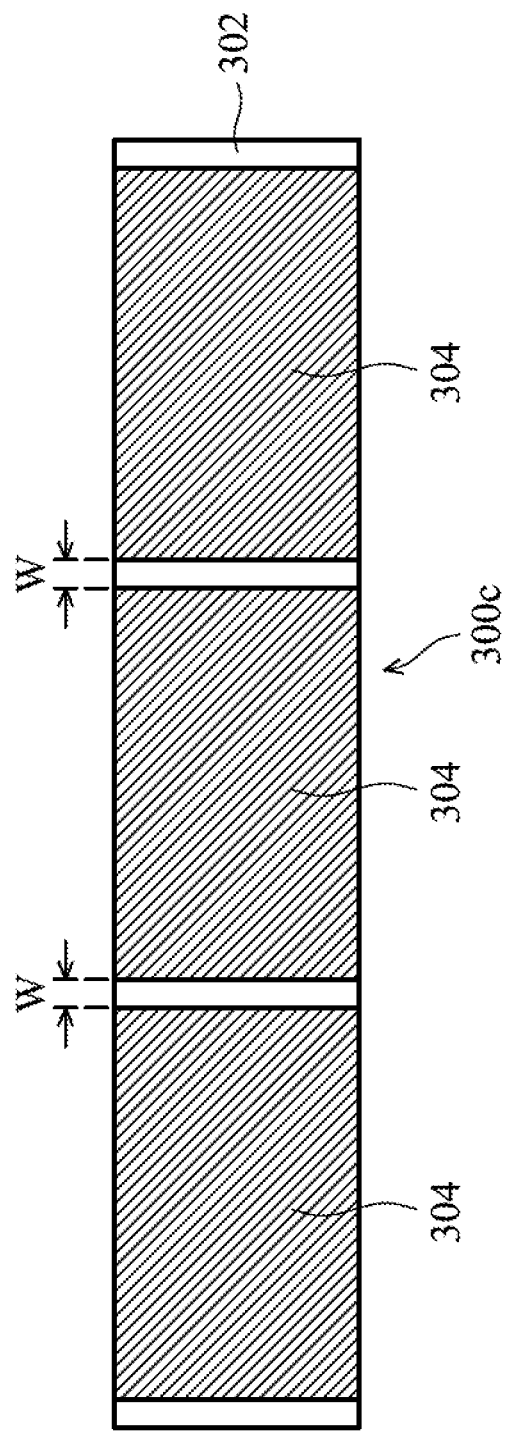
FIG. 12 is a cross-sectional view of a heat plate in accordance with some embodiments of the present disclosure.
Figure 13:
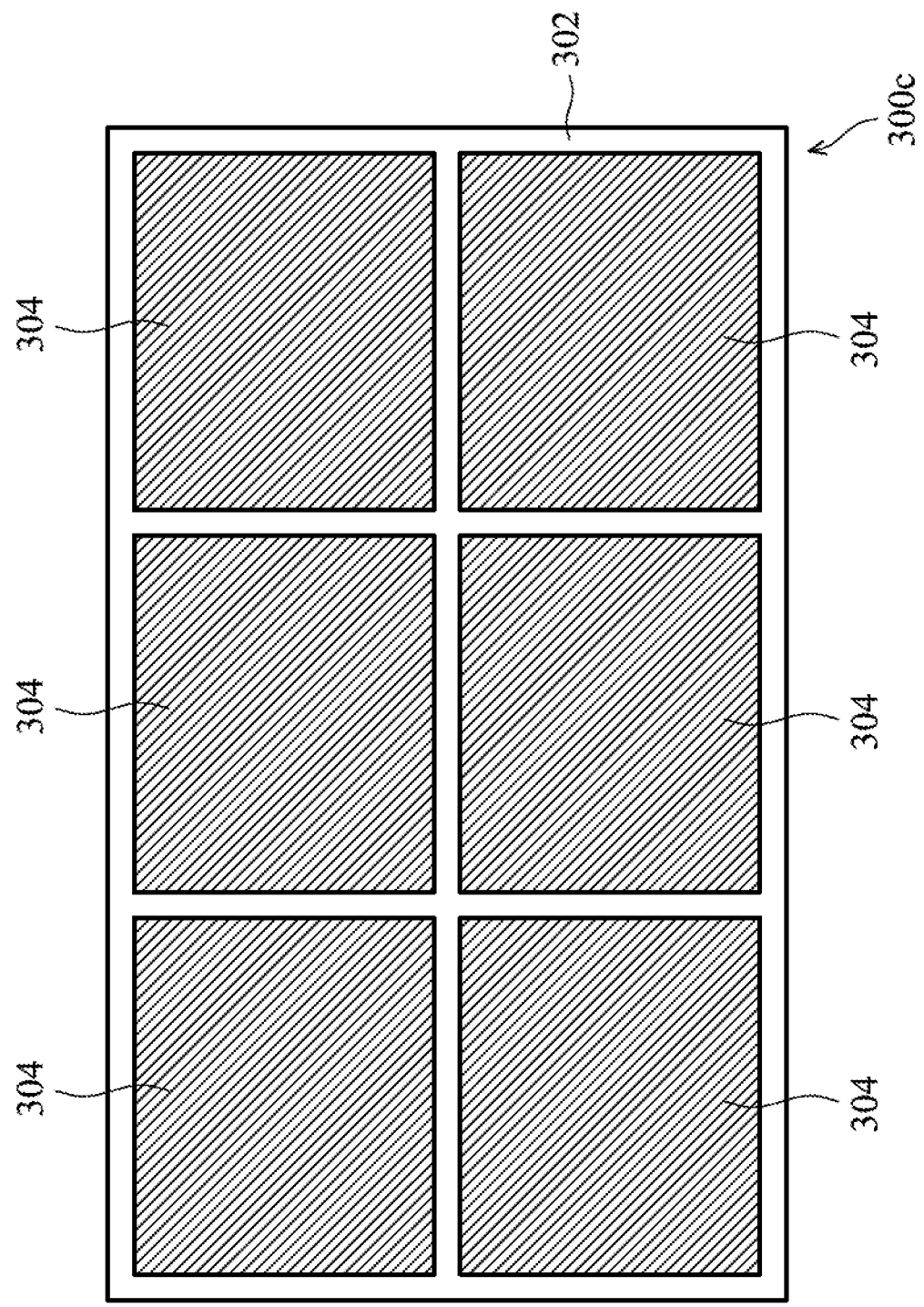
FIG. 13 is a top view of the heat plate shown in FIG. 12 in accordance with some embodiments of the present disclosure.

Referring to FIGS. 12 and 13, FIG. 12 is a cross-sectional view of a heat plate 300c in accordance with some embodiments of the present disclosure. FIG. 13 is a top view of the heat plate 300c shown in FIG. 12 in accordance with some embodiments of the present disclosure. In some embodiments, the heat plate 300c includes a number of the thermal conductive parts 304, and every thermal conductive part 304 is separated from the thermal isolation part 302. As shown in FIG. 13, the thermal conductive parts 304 are surrounded by the thermal isolation part 302. In some embodiments, the width W of the thermal isolation part 302 is smaller than a pitch between the light-emitting units 312'. It spends less time on attaching the light-emitting units 312 to the buffer layer 316 because of multiple thermal conductive parts 304.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a display device, comprising:
    providing a plurality of light-emitting units;
    providing a substrate;
    transferring the plurality of light-emitting units to a transfer head; and
    attaching at least one of the plurality of light-emitting units on the transfer head to the substrate by a bonding process;
    wherein the transfer head and the substrate satisfy the following equation during the bonding process:

$$0 \leq \left| \int_{T1}^{T2} A(T)dT - \int_{T1}^{T3} E(T)dT \right| < 0.01$$

wherein A(T) is a coefficient of thermal expansion of the transfer head,
    E(T) is a coefficient of thermal expansion of the substrate,
    T1 is room temperature,
    T2 is a temperature of the transfer head, and
    T3 is a temperature of the substrate.

2. The method as claimed in claim 1, wherein the transfer head and the substrate satisfy the following equation during the bonding process:

$$0 \leq \left| \int_{T1}^{T2} A(T)dT - \int_{T1}^{T3} E(T)dT \right| < 0.005.$$

3. The method as claimed in claim 1, wherein a material of the transfer head is different from a material of the substrate.

4. The method as claimed in claim 1, further comprising:
    forming an adhesive layer on the transfer head; and
    attaching the plurality of light-emitting units to the adhesive layer, wherein forming the adhesive layer comprises:
    forming a spacer layer on the transfer head, wherein the spacer layer comprises a plurality of openings; and
    filling an adhesive material into the plurality of openings to form the adhesive layer, and the adhesive layer comprising a plurality of adhesive patterns.

5. The method as claimed in claim 4, wherein a height of the spacer layer is less than a height of the adhesive pattern.

6. The method as claimed in claim 4, wherein a height of the spacer layer is greater than the height of the adhesive pattern.

* * * * *